(12) United States Patent
Lin

(10) Patent No.: US 11,611,335 B2
(45) Date of Patent: Mar. 21, 2023

(54) DUTY-CYCLE CORRECTOR PHASE SHIFT CIRCUIT

(71) Applicant: Taiwan Semiconductor Manufacturing Company, Ltd., Hsinchu (TW)

(72) Inventor: Wei Shuo Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/538,291

(22) Filed: Nov. 30, 2021

(65) Prior Publication Data

US 2022/0360258 A1 Nov. 10, 2022

Related U.S. Application Data

(60) Provisional application No. 63/185,159, filed on May 6, 2021.

(51) Int. Cl.
*H03K 5/156* (2006.01)
*H03L 7/095* (2006.01)
*H03L 7/081* (2006.01)

(52) U.S. Cl.
CPC ........ *H03K 5/1565* (2013.01); *H03L 7/0812* (2013.01); *H03L 7/095* (2013.01)

(58) Field of Classification Search
None
See application file for complete search history.

(56) References Cited

U.S. PATENT DOCUMENTS

| 10,218,343 | B1* | 2/2019 | Tomar | G11C 7/222 |
| 10,958,257 | B1* | 3/2021 | Sheen | H03K 5/06 |
| 2009/0140785 | A1* | 6/2009 | Choi | H03K 5/1565 |
| | | | | 327/175 |

OTHER PUBLICATIONS

Chen et al., "An 8Gb/s 0.75mW/GB/s Injection-Locked Receiver with Constant Jitter Tracking Bandwidth and Accurate Quadrature Clock Generation in 40nm CMOS," 21st IEEE International Conference on Electronics, Circuits adn Systems (ICECS), pp. 9-12 (2014).
Lin et al., "A 70-490 MHz 50% Duty-Cycle Correction Circuit in 0.3-μm CMOS," IEEE Asian Solid-State Circuits Conference, pp. 91-94 (2006).
Patil et al., "Duty Cycle Correction Using Negative Feedback Loop An analog solution," 16th International Conference Mixed Design of Integrated Circuits and Systems, pp. 424-426 (Jun. 25-27, 2009).

* cited by examiner

*Primary Examiner* — Cassandra F Cox
(74) *Attorney, Agent, or Firm* — Merchant & Gould P.C.

(57) ABSTRACT

One embodiment of a duty-cycle corrector phase shift (DCCPS) circuit includes a voltage-controlled delay line circuit, a duty-cycle correct circuit, an error amplifier circuit, and DC sampler circuits. Another embodiment of a duty-cycle corrector phase shift circuit includes a digital-controlled delay line circuit, a duty-cycle correct circuit, DC sampler circuits, a comparator circuit, a counter circuit, a control circuit, and a lock detector circuit. In some instances, the DCCPS circuit provides a clock signal with a duty-cycle of approximately fifty percent (50%) and a given phase shift between an input clock signal and the output clock signal.

20 Claims, 28 Drawing Sheets

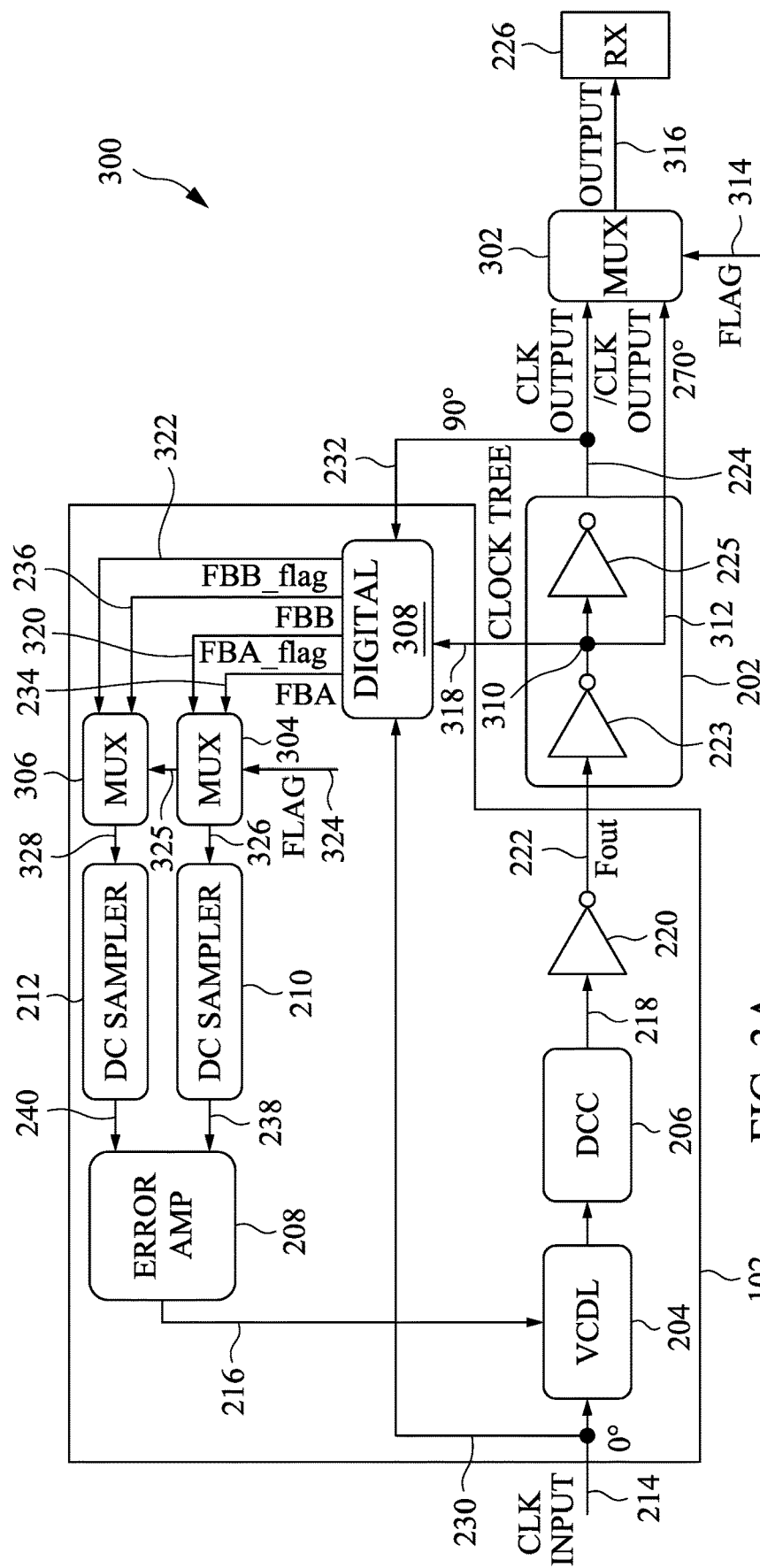
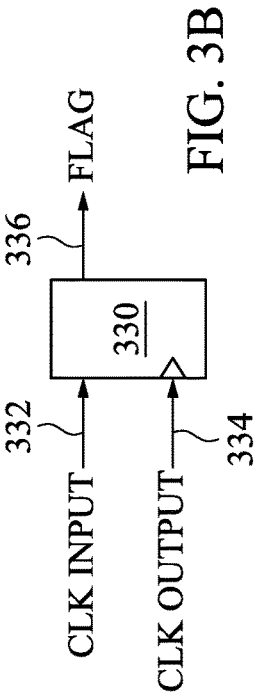
FIG. 3A
FIG. 3B

US 11,611,335 B2

DUTY-CYCLE CORRECTOR PHASE SHIFT CIRCUIT

PRIORITY CLAIM AND CROSS-REFERENCE

The present application claims the benefit of U.S. Provisional Patent Application No. 63/185,159 titled "A Duty-Cycle Corrected Phase Shift Circuit" and filed on May 6, 2021, of which the entire disclosure is hereby incorporated by reference in its entirety.

BACKGROUND

High-density multi-lane forwarded-clock links (FC) are applied in processor interfaces to satisfy the demands of an aggressive bandwidth. In an FC link, a dedicated lane can be used to deliver a synchronous clock shared by multiple data lanes from a transmitter to a receiver. In some embodiments, a de-skew circuit is used to align the received clock with data that is regarded as the most important or important and a power-hungry component in a gigabit receiver. Delay-locked loop (DLL) and phase-locked loop (PLL) are adopted in many conventional de-skew circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a block diagram of a second example of a duty-cycle correcting and phase shifting circuit in accordance with some embodiments;

FIG. 3B illustrates an example data circuit that can be used to generate the Flag signal in accordance with some embodiments;

DETAILED DESCRIPTION

Figure 1:
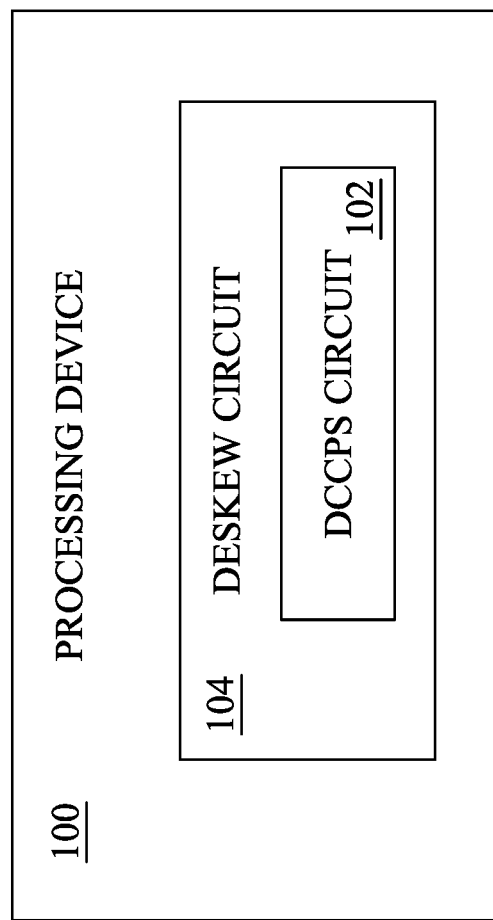
FIG. 1 illustrates a block diagram of a circuit that includes a duty-cycle corrector phase shift circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments disclosed herein provide a duty-cycle corrector phase shift (DCCPS) circuit that includes a voltage-controlled delay line (VCDL) circuit, a duty-cycle corrector (DCC) circuit, an error amplifier circuit, and DC sampler circuits. Other embodiments of a DCCPS circuit include a digital-controlled delay line (DCDL) circuit, a DCC circuit, DC sampler circuits, a comparator circuit, a counter circuit, a control circuit, and a lock detector circuit. In some instances, the DCCPS circuit provides an output clock signal with a duty-cycle of fifty percent (50%), or substantially fifty percent and a given phase shift between an input clock signal and the output clock signal. Example given phase shifts include, but are not limited to, ninety degrees and two hundred and seventy degrees. The DCCPS circuit can be implemented in various types of processing devices. For example, a duty-cycle correcting and phase shifting circuit that includes a DCCPS circuit may be included in a deskew circuit in a processing device.

FIG. 1 illustrates a block diagram of a circuit that includes a DCCPS circuit in accordance with some embodiments. The circuit 100 can be any suitable type of a circuit, including processing devices, memory input/output interfaces, and high-frequency data converters. Example processing devices include, but are not limited to, a central processing unit, a microprocessor, and a digital signal processor. The circuit 100 typically includes multiple circuits, including a DCCPS circuit 102. In a non-limiting nonexclusive example, the DCCPS circuit 102 is implemented in a deskew circuit 104. Other embodiments are not limited to a deskew circuit and can include a memory input/output interface, a data converter circuit, and any other suitable circuit.

Figure 2:
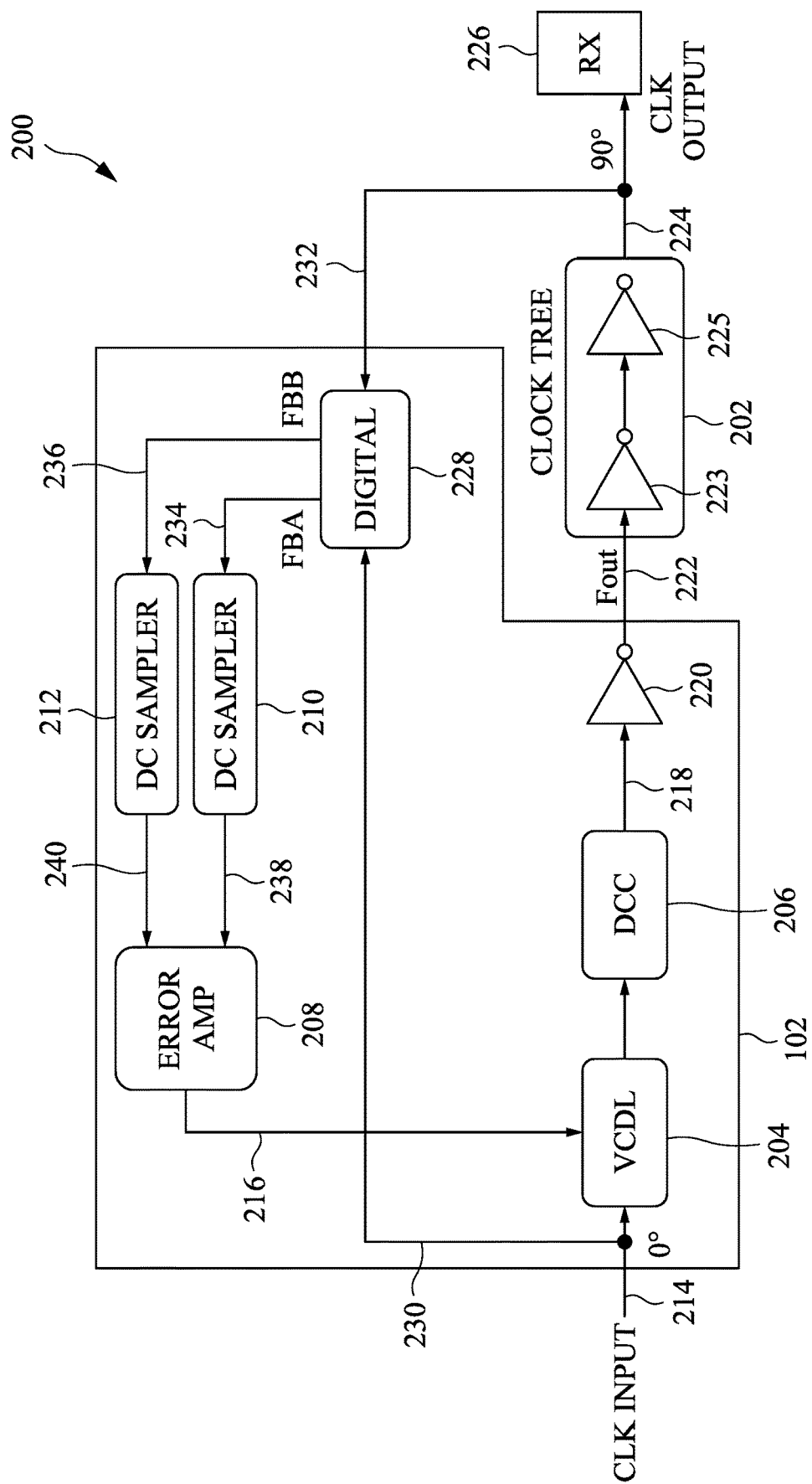
FIG. 2 illustrates a block diagram of a first example of a duty-cycle correcting and phase shifting circuit in accordance with some embodiments.

FIG. 2 illustrates a block diagram of a first example of a duty-cycle correcting and phase shifting circuit in accordance with some embodiments. The example duty-cycle correcting and phase shifting circuit 200 includes a DCCPS circuit 102 operably connected to a clock tree circuit 202. The illustrated DCCPS circuit 102 includes an output of a VCDL circuit 204 operably connected to an input of a DCC circuit 206, an output of an error amplifier circuit 208 operably connected to an input of the VCDL circuit 204, outputs of DC sampler circuits 210, 212 operably connected to inputs of the error amplifier circuit 208, outputs of a digital circuit 228 operably connected to inputs of the DC sampler circuits 210, 212, and an output of the DCC circuit 206 operably connected to an input of an inverter circuit 220. Any suitable VCDL circuit 204, DCC circuit 206, error amplifier circuit 208, DC sampler circuits 210, 212, and digital circuit 228 can be used.

The duty-cycle correcting and phase shifting circuit 200 further includes an output of the inverter circuit 220 operably connected to an input of the clock tree circuit 202. An output of the clock tree circuit 202 is operably connected to an input of a receiver circuit 226 and to an input of the digital circuit 228. An input of the VCDL circuit 204 is operably connected to another input of the digital circuit 228.

The VCDL circuit 204 is operable to adjust the delay of the clock input (CLK input) signal received on signal line 214 based on an error signal received from the error amplifier circuit 208 on signal line 216. The DCC circuit 206 is operable to adjust the duty cycle of the CLK input signal until the CLK input signal has a fifty percent (50%), or a substantially fifty percent (50%) duty cycle. The DCC circuit 206 outputs a signal on signal line 218 that is input into an inverter circuit 220. The inverter circuit 220 outputs an Fout signal on signal line 222. The DCC circuit 206 is locked once the CLK input signal as a fifty percent (50%), or a substantially fifty percent (50%) duty cycle, which causes the Fout signal to maintain the fifty percent (or the substantially fifty percent) duty cycle.

The Fout signal is input into the clock tree circuit 202 and the clock tree circuit 202 outputs a clock output (CLK output) signal on signal line 224. The clock tree circuit 202 is operable to shift the phase of the Fout signal to a given phase shift from the CLK input signal (which is a zero, or substantially, zero degrees). In the illustrated embodiment, the given phase shift is ninety (90), or substantially ninety, degrees, which causes the CLK output signal to have a phase shift of ninety (90) degrees (or substantially ninety degrees) from the CLK input signal. The CLK output signal is input into the receiver circuit 226. In the illustrated embodiment, the clock tree circuit 202 is implemented as an inverter circuit 223 connected in series with an inverter circuit 225. Other embodiments are not limited to this configuration. Any suitable clock tree circuit 202 can be used. One example of an alternative clock tree circuit 202 is a buffer circuit connected in series with a buffer circuit.

The CLK input signal is input into the digital circuit 228 on signal line 230. The CLK output signal is also input into the digital circuit 228 on signal line 232. In some embodiments, the digital circuit 228 is an AND gate or an OR gate. The digital circuit 228 is operable to generate an output pulse FBA on signal line 234 and an output pulse FBB on signal line 236. As will be described in more detail in conjunction with FIGS. 5-10, the pulse widths of the FBA and FBB signals are dependent upon the timing of the phase shifts of the CLK input and the CLK output signals (e.g., zero degrees and ninety (90) degrees, respectively). The FBA signal is input into the DC sampler circuit 210 and the FBB signal is input into the DC sampler circuit 212.

Each DC sampler circuit 210, 212 translates the pulse width of the FBA signal or the FBB signal, respectively, into a DC voltage signal until the pulse widths of the FBA signal and the FBB signals are equal. When the pulse widths of the FBA and FBB signals are equal, the DCCPS circuit 102 is locked and the CLK output signal on signal line 224 is phase shifted ninety (90) degrees (or substantially ninety degrees) from the CLK input signal (which has a phase shift of zero (0), or substantially zero, degrees).

The error amplifier circuit 208 receives the DC voltage signals on signal lines 238, 240. The error amplifier circuit 208 is operable to compare the DC voltage signals and based on the comparison, output the error signal on signal line 216. The error signal controls the amount of the delay that is generated by the VCDL circuit 204.

FIG. 3A illustrates a block diagram of a second example of a duty-cycle correcting and phase shifting circuit in accordance with some embodiments. The duty-cycle correcting and phase shifting circuit 300 is similar to the duty-cycle correcting and phase shifting circuit 200 shown in FIG. 2 except for the select circuits 302, 304, 306. For brevity, the circuits that are depicted in both FIGS. 2 and 3A are not described again in conjunction with FIG. 3A.

The select circuits 302, 304, 306 are represented as multiplexers in FIG. 3A, but any suitable select circuit can be used. The select circuit 302 is operably connected between an output of the clock tree circuit 202 and an input of the receiver circuit 226. The select circuit 304 is operably connected between two outputs of the digital circuit 308 and the DC sampler circuit 210. The select circuit 306 is operably connected between two additional outputs of the digital circuit 308 and the DC sampler circuit 212.

In FIG. 3A, the inverted Fout signal at node 310 is output from the clock tree circuit 202 on signal line 312 and represents a/CLK output signal that is phase shifted a given number of degrees from the CLK input signal. In one embodiment, the/CLK output signal has a phase shift of two hundred and seventy (270) degrees (or substantially two hundred and seventy degrees) from the CLK input signal (zero (0) degrees). The CLK output signal on signal line 224 has a given phase shift from the CLK input signal (e.g., phase shift of ninety or substantially ninety degrees).

The CLK output signal on signal line 224 and the/CLK output signal on signal line 312 are input into the select circuit 302. A Flag signal is received by the select circuit 302 on signal line 314 and is used as a select signal for the select circuit 302. Based on the state of the Flag signal, the select circuit 302 outputs either the CLK output signal or the /CLK output signal as the output clock signal on signal line 316. In one embodiment, the select circuit 302 outputs the /CLK output signal on signal line 316 when the Flag signal level is zero and outputs the CLK output signal on the signal line 316 when the Flag signal level is one.

The inverted Fout signal at node 310 (the /CLK output signal) is input into the digital circuit 308 on signal line 318. The CLK output signal is received by the digital circuit 308 on signal line 232. The CLK input signal is received by the digital circuit 308 on signal line 230. An example schematic diagram of the digital circuit 308 is shown and described in conjunction with FIG. 4.

Based on the states of the inverted Fout signal, the /CLK output signal, and the CLK input signal, the digital circuit 308 outputs the FBA signal on signal line 234, an FBA_flag signal on signal line 320, an FBB flag signal on signal line 322, and the FBB signal on signal line 236. The FBA and the FBA_flag signals are received by the select circuit 304, and the FBB and the FBB flag signals are received by the select circuit 306. Flag signals are received by the select circuits 304, 306 on signal lines 324, 325 and are used as select signals for the select circuits 304, 306. Based on the state of the Flag signal on signal line 324, the select circuit 304 outputs either the FBA or the FBA_flag signal on signal line 326. Based on the state of the Flag signal on signal line 325, the select circuit 306 outputs either the FBB or the FBB flag signal on signal line 328.

The DC sampler circuit 210 translates the pulse width of the FBA or the FBA_flag signal into a DC voltage signal. The DC sampler circuit 212 translates the pulse width of the FBB or the FBB flag signal into a DC voltage signal until the pulse widths of the signals output on signal lines 238, 240 are equal (or substantially equal). When the pulse widths are equal or substantially equal, the DCCPS circuit 102 is locked and the output clock signal on signal line 316 is phase shifted a given number of degrees from the CLK input signal. In one embodiment, the output clock signal is phase shifted ninety (90) degrees from the CLK input signal (which has a phase shift of zero (0) degrees).

FIG. 3B illustrates a data circuit that can be used to generate the Flag signal in accordance with some embodiments. The data circuit 330 can be any suitable delay circuit. In FIG. 3B, the data circuit 330 is a data flip flop (DFF). The CLK input signal is received by the data circuit 330 on signal line 332. The CLK output signal is received by the data circuit 330 on signal line 334. The data circuit 330 captures the signal level (or value) of the CLK input signal at a particular time or part of the clock cycle (e.g., the rising edge of the CLK input signal). The data circuit 330 outputs the captured value as the FLAG signal on signal line 336. Thus, depending on the value of the CLK input signal at the particular time, the signal level or value of the FLAG signal can change or remain unchanged. The other times of the CLK input signal do not cause the signal level of the FLAG signal to change. The signal line 336 represents the signal lines 314, 324, and 325 that are used to input the FLAG signal into the select circuits 302, 304, 306, respectively.

Figure 3C:
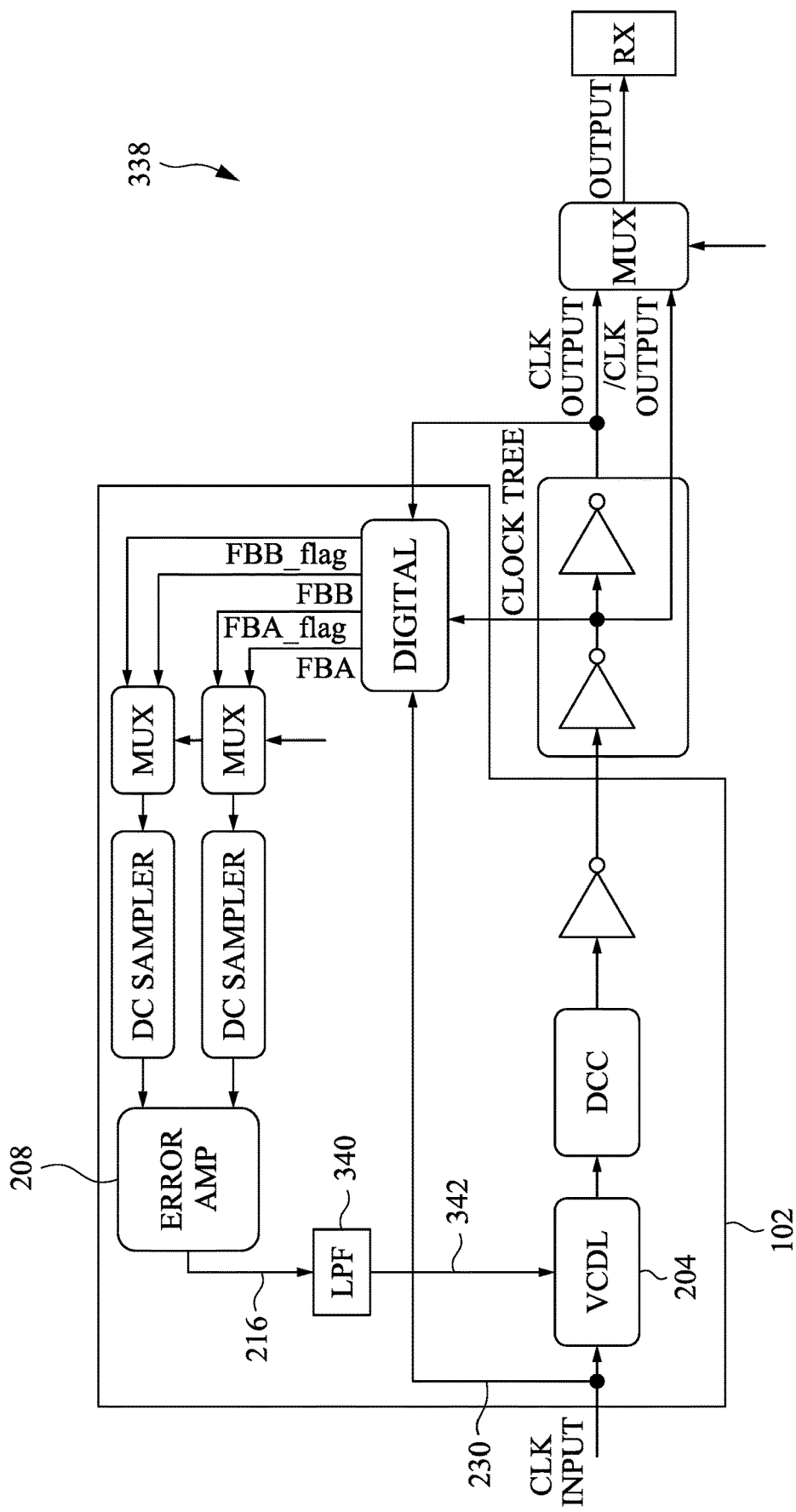
FIG. 3C illustrates a block diagram of a third example of a duty-cycle correcting and phase shifting circuit in accordance with some embodiments.

FIG. 3C illustrates a block diagram of a third example of a duty-cycle correcting and phase shifting circuit in accordance with some embodiments. The duty-cycle correcting and phase shifting circuit 338 is similar to the duty-cycle correcting and phase shifting circuit 300 shown in FIG. 3A except for the addition of a low pass filter (LPF) circuit 340. In some instances, the DCCPS circuit 102 may experience stability issues. The LPF circuit 340 can be used to stabilize the DCCPS circuit 102.

The LPF circuit 340 is operably connected between the output of the error amplifier circuit 208 and the input of the VCDL circuit 204. The LPF circuit 340 receives the error signal output from the error amplifier circuit 208 on signal line 216. The LFP circuit 340 provides a filtered error signal to the VCDL circuit 204 on signal line 342. Although not shown in FIGS. 10-16, some or all of the embodiments shown in FIGS. 10 and 16 can include the LPF circuit 340 operably connected between the error amplifier circuit 208 and the VCDL circuit 204. Additionally or alternatively, the embodiment depicted in FIG. 15 may include the LFP circuit 340 operably connected between the control circuit 1510 and the DCDL circuit 1502. In some implementations, the embodiment depicted in FIGS. 11-14 may include the LFP circuit 340 operably connected between the error amplifier circuit 208 and the LDO circuit 1102.

Figure 4:
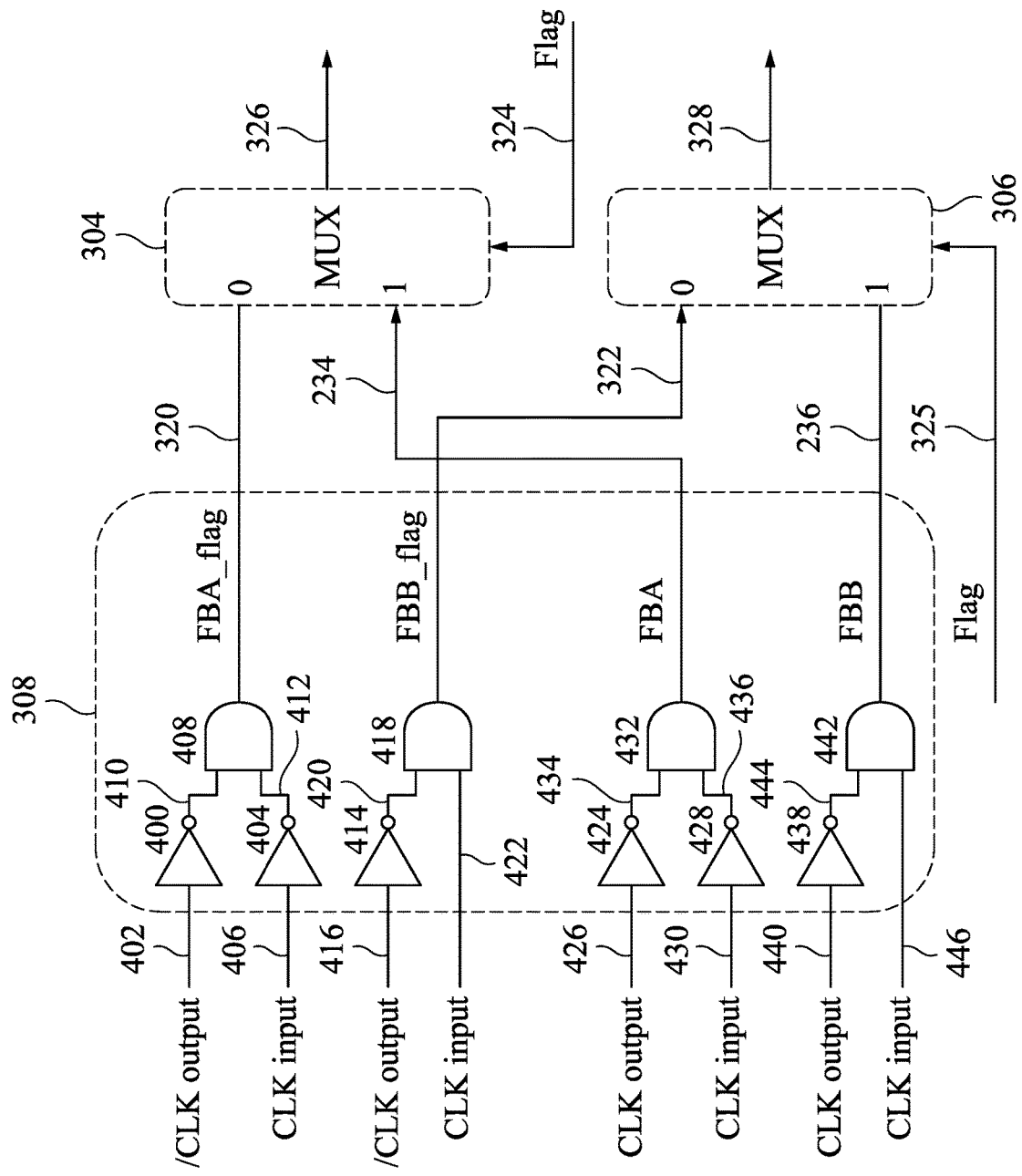
FIG. 4 illustrates a schematic diagram of an example digital circuit shown in FIGS. 3A and 3C in accordance with some embodiments.

FIG. 4 illustrates a schematic diagram of an example digital circuit shown in FIGS. 3A and 3C in accordance with some embodiments. As described earlier, the outputs of the digital circuit 308 are operably connected to respective inputs of the select circuits 304, 306. The FBA and the FBA_flag signals are input into the select circuit 304 on signal lines 234, 320, respectively. The FBB and the FBB flag signals are input into the select circuit 306 on signal lines 236, 322, respectively. To generate the FBA_flag signal, the /CLK output signal is input into an inverter circuit 400 on signal line 402 and the CLK input signal is input into an inverter circuit 404 on signal line 406. The inverted /CLK output signal is input into the AND gate 408 on signal line 410. The inverted CLK input signal is input into the AND gate 408 on signal line 412. The FBA_flag signal is output from the AND gate 408 on signal line 320.

To generate the FBB flag signal, the /CLK output signal is input into an inverter circuit 414 on signal line 416. The inverted /CLK output signal is input into the AND gate 418 on signal line 420. The CLK input signal is input into the AND gate 418 on signal line 422. The FBB flag signal is output from the AND gate 418 on signal line 322.

To generate the FBA signal, the CLK output signal is input into an inverter circuit 424 on signal line 426 and the CLK input signal is input into inverter circuit 428 on signal line 430. The inverted CLK output signal is input into the AND gate 432 on signal line 434. The inverted CLK input signal is input into the AND gate 432 on signal line 436. The FBA signal is output from the AND gate 432 on signal line 234.

To generate the FBB signal, the CLK output signal is input into an inverter circuit 438 on signal line 440. The inverted CLK output signal is input into the AND gate 442 on signal line 444. The CLK input signal is input into the AND gate 442 on signal line 446. The FBB signal is output from the AND gate 442 on signal line 236.

The states of the FBA, FBB, FBA_flag, and FBB flag signals output from the digital circuit 308 are shown in Table 1. The "X" in Table 1 indicates a "do not care" state that is based on the signal level of the Flag signal. For example, the signal level of the CLK OUT signal will never be high (e.g., "1") when the signal level of the Flag signal is high (e.g., see FIGS. 3A and 3B).

TABLE 1

| CLK OUT | /CLK OUT | CLK IN | FBA Flag = 1 | FBB Flag = 1 | FBA_FLAG Flag = 0 | FBB_FLAG Flag = 0 |
|---|---|---|---|---|---|---|
| 0 | 1 | 0 | 1 | 0 | X | X |
| 0 | 1 | 1 | 0 | 1 | X | X |
| 1 | 0 | 0 | X | X | 1 | 0 |
| 1 | 0 | 1 | X | X | 0 | 1 |

The states of the FBA and the FBB signals depend on the states of the CLK output and CLK input signals. The states of the FBA_flag and FBB flag signals depend on the states of the /CLK output and CLK input signals. Depending on the state of the flag signal that is input into the select circuits 304, 306 on signal lines 324, 325, respectively, the select circuit 304 outputs either the FBA or the FBA_flag signal and the select circuit 306 outputs either the FBB or the FBB flag signal. For example, when the flag signal is at a low signal level, the FBA_flag signal is output from the select circuit 304 on signal line 326 and the FBB flag signal is output from the select circuit 306 on signal line 328. When the flag signal is at a high signal level, the FBA signal is output from the select circuit 304 on signal line 326 and the FBB signal is output from the select circuit 306 on signal line 328.

Figure 5:
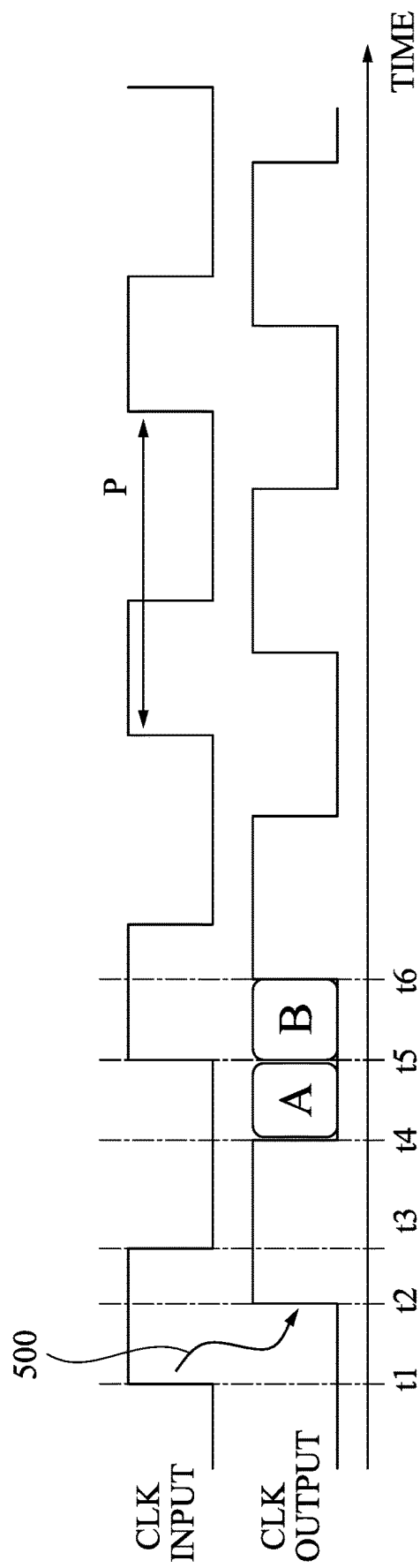
FIG. 5 illustrates an example first timing diagram for the duty-cycle correcting and phase shifting circuit shown in FIGS. 2, 3A, and 3C in accordance with some embodiments.

FIG. 5 illustrates an example first timing diagram for the duty-cycle correcting and phase shifting circuits shown in FIGS. 2, 3A, and 3C in accordance with some embodiments. In the example timing diagram, the CLK input signal has a duty cycle of forty percent (40%), the CLK output signal has a duty cycle of fifty percent (50%), and the frequency of the clock is two (2) gigahertz (GHz). In the timing diagram, the CLK output signal is produced after the DCC circuit 206 is locked because the duty cycle of the CLK output signal is fifty percent (or substantially fifty percent).

The rising edge of the CLK input signal occurs at time t1 and the rising edge of the CLK output signal occurs at time t2. The time t2 occurs at the midpoint (or substantially the midpoint) of the pulse width of the CLK input signal. In the example timing diagram, the midpoint of the pulse width of the CLK input signal occurs between time t1 and time t3. Accordingly, the CLK output signal is phase shifted ninety (90), or substantially ninety degrees from the CLK input signal (phase shift represented by the arrow 500). When the CLK output signal is phase shifted ninety (90) degrees from the CLK input signal, the area of section A of the CLK output signal (e.g., the low signal level time period) located between times t4 and t5 equals (or substantially equals) the area of section B of the low signal level time period of the CLK output signal (located between times t5 and t6). In a non-limiting nonexclusive example, when the period P of the CLK input signal is five hundred (500) picoseconds, the delay between the rising edge of the CLK input signal and the rising edge of the CLK output signal is one hundred and twenty-five picoseconds.

Figure 6:
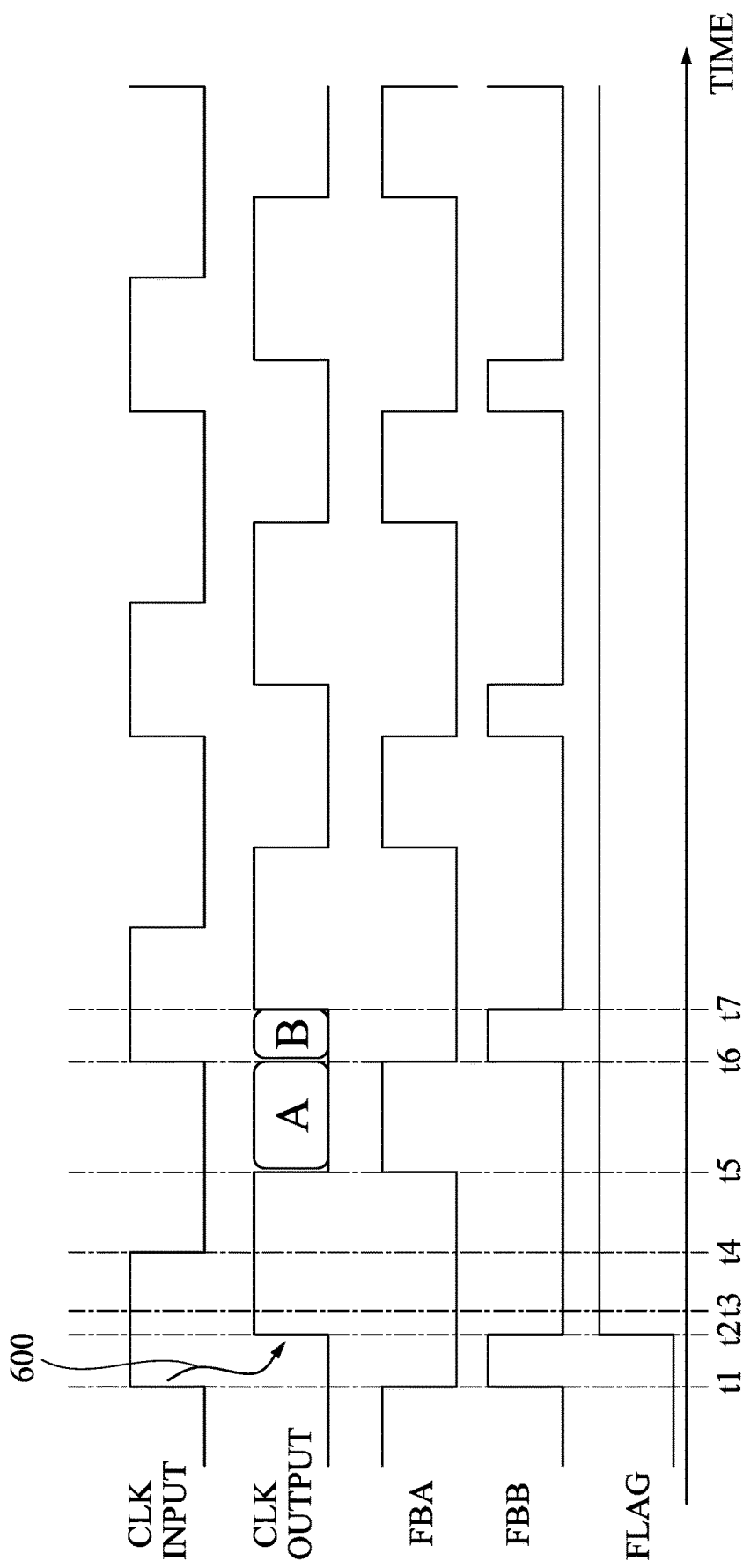
FIG. 6 illustrates an example second timing diagram for the duty-cycle correcting and phase shifting circuit shown in FIGS. 3A and 3C in accordance with some embodiments.

FIG. 6 illustrates an example second timing diagram for the duty-cycle correcting and phase shifting circuit shown in FIGS. 3A and 3C in accordance with some embodiments. In the representative timing diagram, the CLK input signal has a duty cycle of forty percent (40%), the CLK output signal has a duty cycle of fifty percent (50%), and the frequency of the clock is two (2) GHz. The timing diagram presents an embodiment where the phase shift between the CLK input and the CLK output signals is less than ninety (90) degrees. In such embodiments, the VCDL circuit (e.g., VCDL circuit 204 in FIG. 3A) increases the amount of delay in the received CLK input signal until the phase shift between the CLK input and the CLK output signals is ninety degrees (or substantially ninety degrees).

The rising edge of the CLK input signal occurs at time t1 and the rising edge of the CLK output signal occurs at time t2. In FIG. 6, the time t2 occurs before time t3, where time t3 is located at the midpoint (or substantially the midpoint) of the pulse width of the CLK input signal. In the example timing diagram, the midpoint of the pulse width of the CLK input signal occurs between time t1 and time t4. Thus, the phase shift between the rising edge of the CLK input signal and the rising edge of the CLK output signal is less than ninety (90) degrees (phase shift represented by the arrow 600). When the phase shift is less than ninety degrees, the area of section A of the low signal level time period of the CLK output signal located between times t5 and t6 is greater than the area of section B of the low signal level time period of the CLK output signal (located between times t6 and t7).

At time t2, the Flag signal transitions to a high level, which causes the select circuit 302 to select the CLK output signal as the output clock signal (e.g., select circuit 302 in FIG. 3A). Also, based on the high signal level of the Flag signal, the FBA signal is output from the select circuit 304 and the FBB signal is output from the select circuit 306 (e.g., select circuits 304, 306 in FIG. 4). After time t2, the DC sampler circuits 210, 212 translate the pulse widths of the FBA and the FBB signals into DC voltage signals that are received by the error amplifier circuit 208. Because the phase shift between the CLK input and the CLK output signals is less than ninety (90) degrees, the error signal output by the error amplifier circuit 208 causes the VCDL circuit 204 to increase the amount of delay in the received CLK input signal until the phase shift between the CLK input and the CLK output signals is ninety degrees (or substantially ninety degrees). The pulse widths of the FBA and the FBB signals are equal, or substantially equal, when the phase shift is ninety (90) degrees (or substantially ninety degrees).

Figure 7:
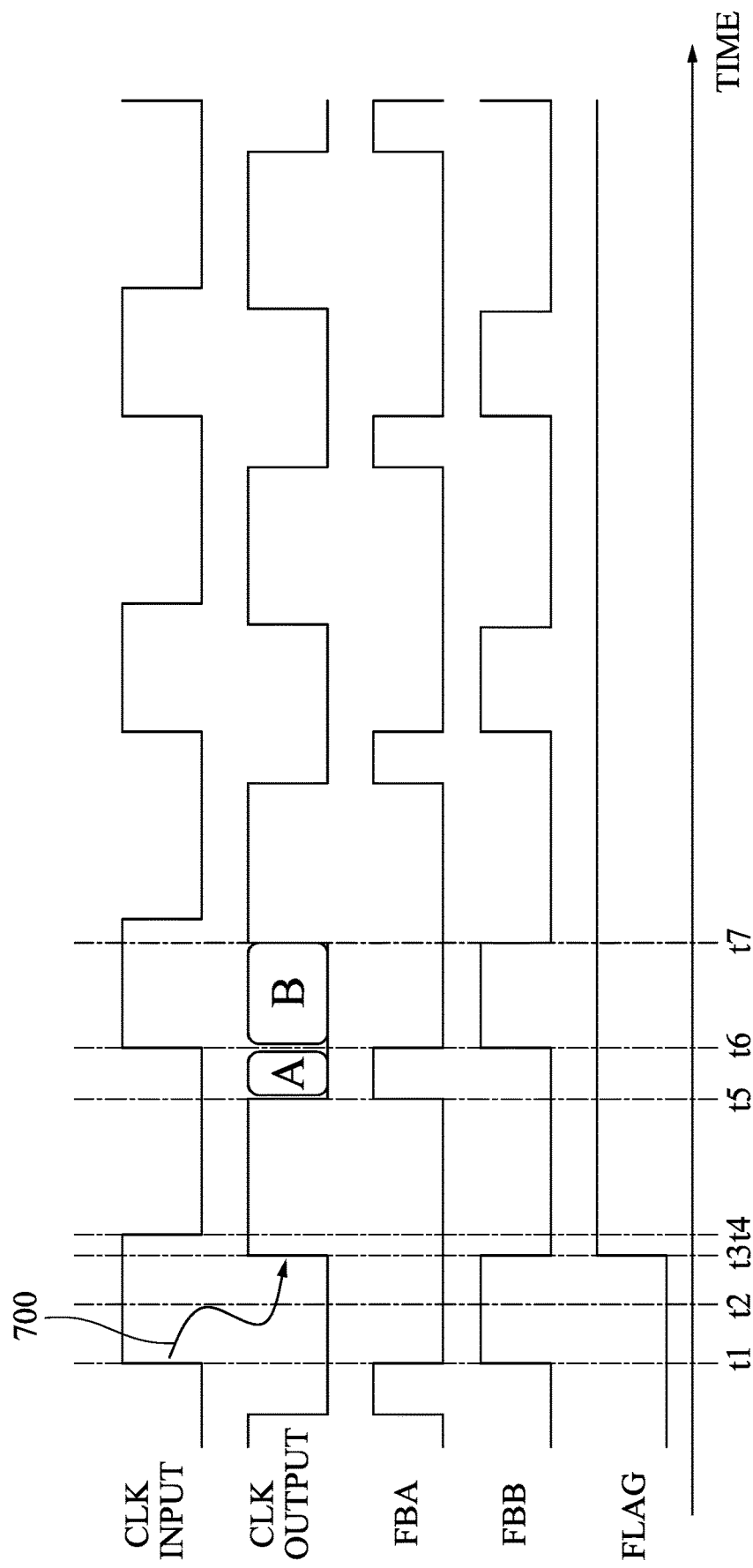
FIG. 7 illustrates an example third timing diagram for the duty-cycle correcting and phase shifting circuit shown in FIGS. 3A and 3C in accordance with some embodiments.

FIG. 7 illustrates an example third timing diagram for the duty-cycle correcting and phase shifting circuit shown in FIGS. 3A and 3C in accordance with some embodiments. In the representative timing diagram, the CLK input signal has a duty cycle of forty percent (40%), the CLK output signal has a duty cycle of fifty percent (50%), and the frequency of the clock is two (2) GHz. The timing diagram presents an embodiment where the phase shift between the CLK input and the CLK output signals is greater than ninety (90) degrees. In such embodiments, the VCDL circuit (e.g., VCDL circuit 204 in FIG. 3A) decreases the amount of delay in the received CLK input signal until the phase shift between the CLK input and the CLK output signals is ninety degrees (or substantially ninety degrees).

The rising edge of the CLK input signal occurs at time t1 and the rising edge of the CLK output signal occurs at time t3. In FIG. 7, the time t3 occurs after time t2, where time t2 is located at the midpoint of the pulse width of the CLK input signal. In the example timing diagram, the midpoint of the pulse width of the CLK input signal occurs between time t1 and time t4. Thus, the phase shift between the rising edge of the CLK input signal and the rising edge of the CLK output signal is greater than ninety (90) degrees (phase shift represented by the arrow 700). When the phase shift is greater than ninety degrees, the area of section A of the low signal level time period of the CLK output signal located between times t5 and t6 is less than the area of section B of the low signal level time period of the CLK output signal (located between times t6 and t7).

An FBB pulse is generated between times t1 and t3. At time t3, the Flag signal transitions to a high signal level, which causes the select circuit 302 to select the CLK output signal as the output clock signal (e.g., select circuit 302 in FIG. 3A). Also, based on the high signal level of the Flag signal, the FBA signal is output from the select circuit 304 and the FBB signal is output from the select circuit 306 (e.g., select circuits 304, 306 in FIG. 4). After time t3, the DC sampler circuits 210, 212 translate the pulse widths of the FAA and the FBB signals into DC voltage signals that are received by the error amplifier circuit 208. Because the phase shift between the CLK input and the CLK output signals is greater than ninety (90) degrees, the error signal output by the error amplifier circuit 208 causes the VCDL circuit 204 to decrease the amount of delay in the received CLK input signal until the phase shift between the CLK input and the CLK output signals is ninety (90) degrees (or substantially ninety degrees). When the phase shift is ninety, or substantially ninety degrees, the pulse widths of the FBA and the FBB signals are equal or substantially equal.

Figure 8:
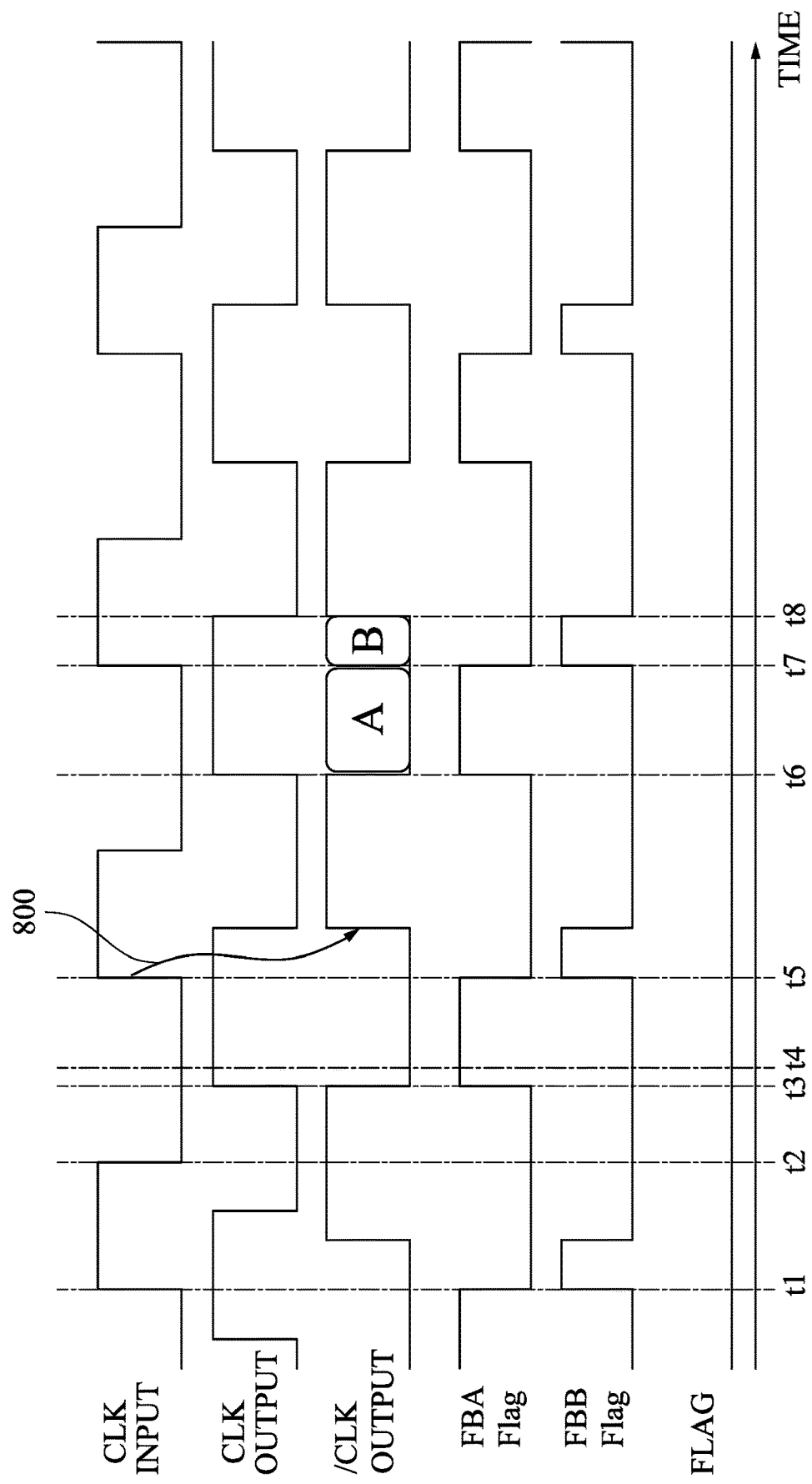
FIG. 8 illustrates an example fourth timing diagram for the duty-cycle correcting and phase shifting circuit shown in FIGS. 3A and 3C in accordance with some embodiments.

FIG. 8 illustrates an example fourth timing diagram for the correcting and phase shifting circuit shown in FIGS. 3A and 3C in accordance with some embodiments. FIG. 8 depicts an embodiment where the falling edge of the CLK output signal and the rising edge of the /CLK output signal occur at the midpoint (or substantially the midpoint) of the low signal level of the CLK input signal (between times t2 and t5). In such embodiments, the FBA_flag and FBB flag signals are used to produce the error signal that controls the amount of delay provided by the VCDL circuit (e.g., VCDL circuit 204 in FIG. 3A). In the representative timing diagram, the CLK input signal has a duty cycle of forty percent (40%), the CLK output signal has a duty cycle of fifty percent (50%), and the frequency of the clock is two (2) GHz.

The rising edge of the CLK input signal occurs at time t1 and the rising edge of the CLK output signal occurs at time t3. In FIG. 8, the time t3 occurs before time t4, where time t4 is located at the midpoint (or substantially the midpoint) of the low signal level of the CLK input signal. In the example timing diagram, the midpoint of the low signal level of the CLK input signal occurs between times t2 and t5. Thus, the phase shift between the rising edge of the CLK input signal and the rising edge of the /CLK output signal is less than ninety (90) degrees (phase shift represented by the arrow 800). When the phase shift is less than ninety (90) degrees, the area of section A of the /CLK output signal located between times t6 and t7 is greater than the area of section B of the /CLK output signal (located between times t7 and t8).

The Flag signal remains at a low signal level, which causes the /CLK output signal to be selected as the output clock signal (e.g., select circuit 302 in FIG. 3A). Also, based on the low signal level of the Flag signal, the FBA_flag signal is output from the select circuit 304 and the FBB flag signal is output from the select circuit 306 (e.g., select circuits 304, 306 in FIG. 4). The DC sampler circuits (e.g., DC sampler circuits 210, 212 in FIG. 3A) translate the pulse widths of the FAA flag and the FBB flag signals into DC voltage signals that are received by the error amplifier circuit (e.g., error amplifier circuit 208 in FIG. 3A). Because the phase shift between the CLK input and the /CLK output signals is less than ninety (90) degrees, the error signal output by the error amplifier circuit causes the VCDL circuit to increase the amount of delay in the received CLK input signal until the phase shift between the CLK input and the /CLK output signals is ninety (90) degrees (or substantially ninety degrees). When the phase shift is ninety, or substantially ninety degrees, the pulse widths of the FBA_flag and the FBB flag signals are equal (or substantially equal).

Figure 9:
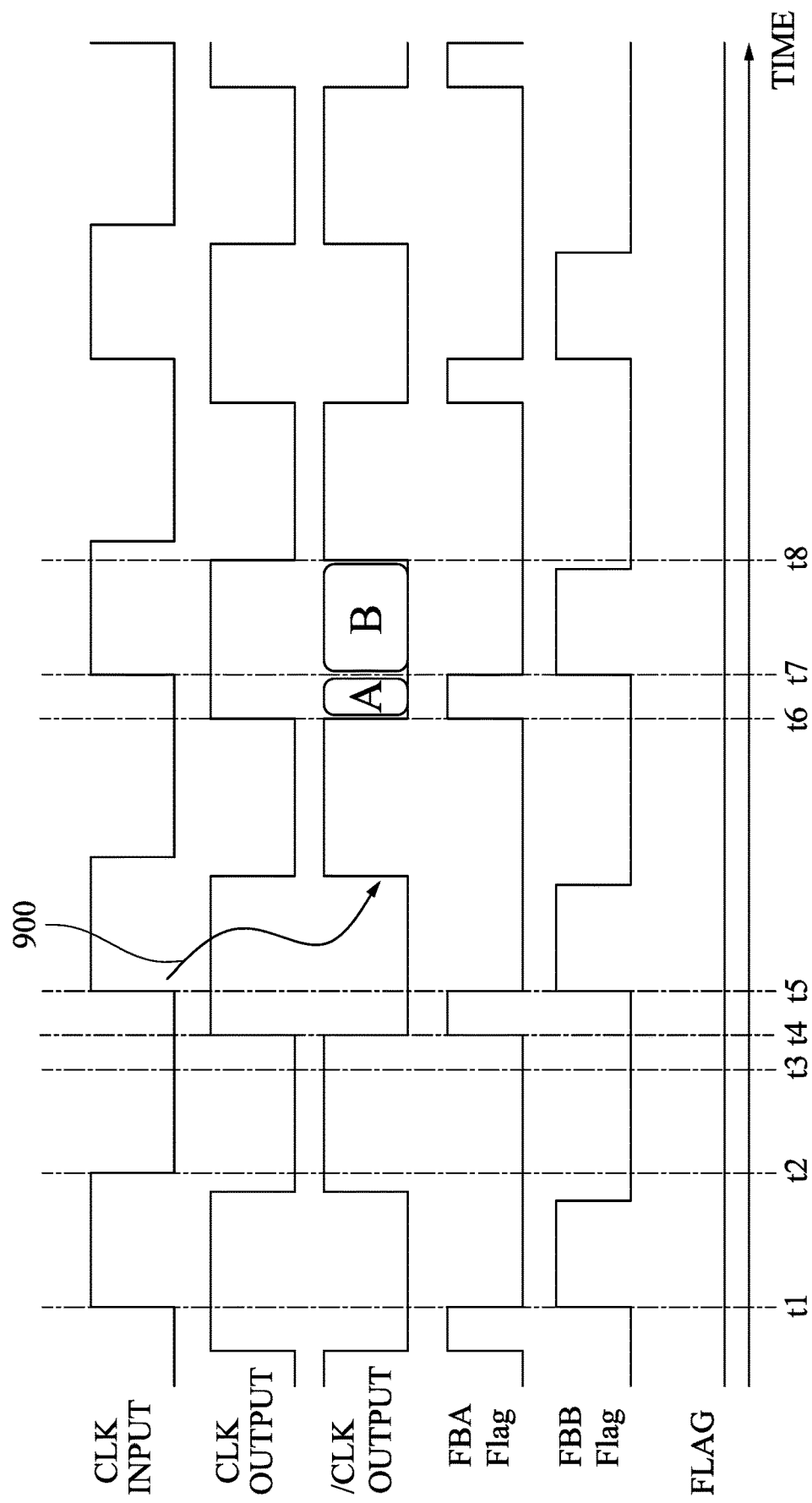
FIG. 9 illustrates an example fifth timing diagram for the duty-cycle correcting and phase shifting circuit shown in FIGS. 3A and 3C in accordance with some embodiments.

FIG. 9 illustrates an example fifth timing diagram for the correcting and phase shifting circuit shown in FIGS. 3A and 3C in accordance with some embodiments. Like FIG. 8, FIG. 9 depicts an embodiment where the falling edge of the CLK output signal and the rising edge of the /CLK output signal occur at the midpoint (or substantially the midpoint) of the low signal level of the CLK input signal (between times t2 and t5). The FBA_flag and FBB flag signals are used to produce the error signal that controls the amount of delay provided by the VCDL circuit (e.g., VCDL circuit 204 in FIG. 3A). In the representative timing diagram, the CLK input signal has a duty cycle of forty percent (40%), the CLK output signal has a duty cycle of fifty percent (50%), and the frequency of the clock is two (2) GHz.

The rising edge of the CLK input signal occurs at time t1 and the rising edge of the /CLK output signal occurs at time t4. In FIG. 9, the time t4 occurs after time t3, where time t3 is located at the midpoint (or substantially the midpoint) of the low signal level of the CLK input signal (between times t2 and t5). Thus, the phase shift between the rising edge of the CLK input signal and the rising edge of the /CLK output signal is greater than ninety (90) degrees (phase shift represented by the arrow 900). When the phase shift is greater than ninety (90) degrees, the area of section A of the CLK output signal located between times t6 and t7 is less than the area of section B of the CLK output signal (located between times t7 and t8).

The Flag signal remains at a low signal level, which causes the /CLK output signal to be selected as the output clock signal (e.g., select circuit 302 in FIG. 3A). Also, based on the low signal level of the Flag signal, the FBA_flag signal is output from the select circuit 304 and the FBB flag signal is output from the select circuit 306 (FIG. 4). The DC sampler circuits (e.g., DC sampler circuits 210, 212 in FIG. 3A) translate the pulse widths of the FAA flag and the FBB flag signals into DC voltage signals that are received by the error amplifier circuit (e.g., error amplifier circuit 208 in FIG. 3A). The error signal output by the error amplifier circuit causes the VCDL circuit to decrease the amount of delay in the received CLK input signal until the phase shift between the CLK input and the /CLK output signals is ninety (90), or substantially ninety degrees. When the phase shift is ninety (90) or substantially ninety degrees, the pulse widths of the FBA_flag and the FBB flag signals are equal (or substantially equal).

Figure 10:
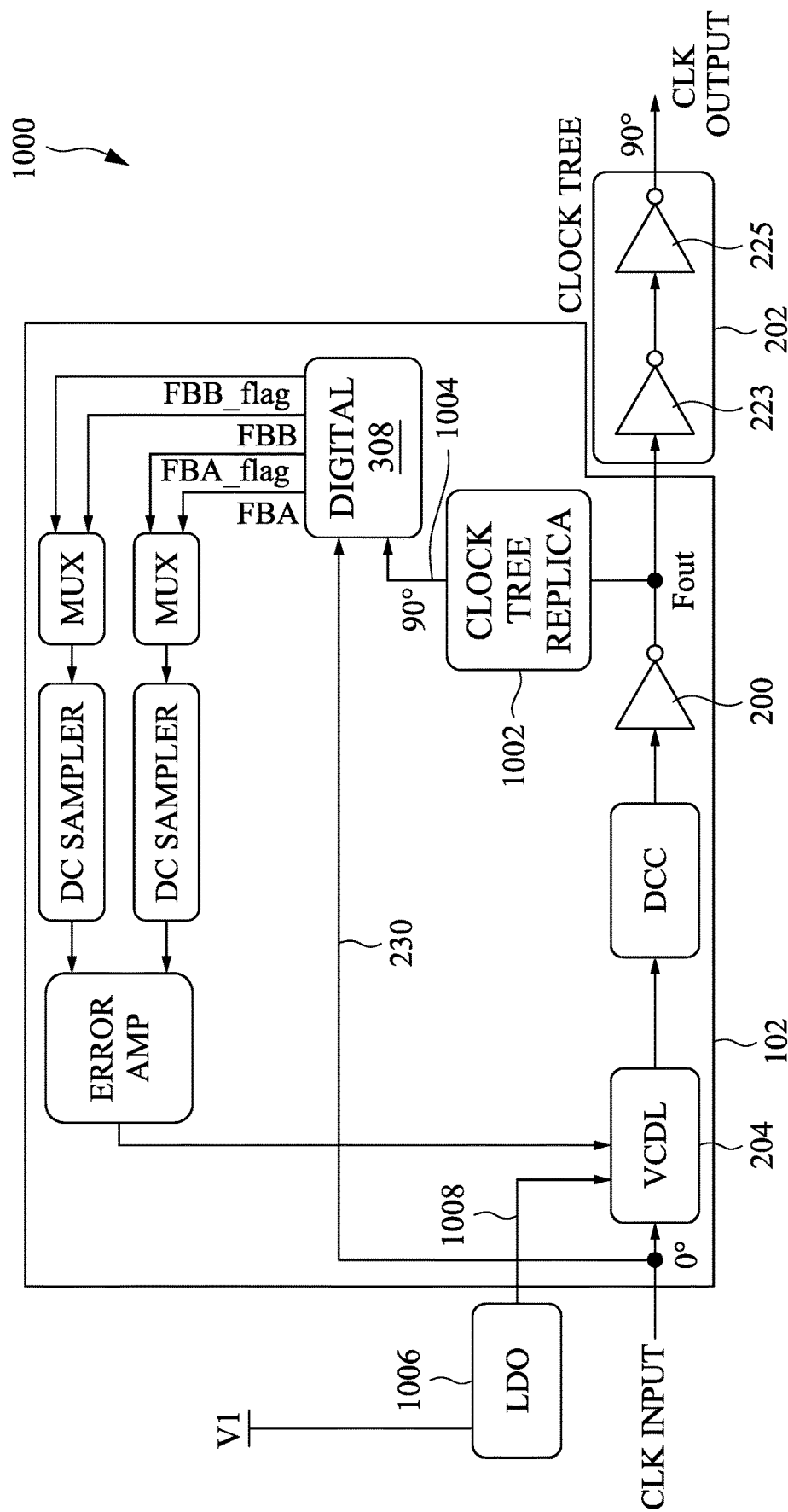
FIG. 10 illustrates a block diagram of a fourth example of a duty-cycle correcting and phase shifting circuit in accordance with some embodiments.

FIG. 10 illustrates a block diagram of a fourth example of a duty-cycle correcting and phase shifting circuit in accordance with some embodiments. The duty-cycle correcting and phase shifting circuit 1000 is similar to the duty-cycle correcting and phase shifting circuit 200 shown in FIG. 2 except for the clock tree replica circuit 1002 and the low dropout (LDO) circuit 1006. For brevity, the circuits that are depicted in both FIGS. 2 and 10 are not described again in conjunction with FIG. 10.

The DCCPS circuit 102 includes the clock tree replica circuit 1002 operably connected between the output of the inverter circuit 220 and the input of the digital circuit 308. The clock tree replica circuit 1002 is operable to shift the phase of the Fout signal a given number of degrees. In the illustrated embodiment, the clock tree replica circuit 1002 shifts the phase of the Fout signal ninety (90) degrees (or substantially ninety degrees). The construction of the clock tree replica circuit 1002 is the same as the construction of the clock tree circuit 202. In the illustrated embodiment, the clock tree circuit 202 includes an inverter circuit 223 connected in series with an inverter circuit 225. Thus, the clock tree replica circuit 1002 includes two inverters connected in series. In some embodiments, the clock tree replica circuit 1002 reduces the amount of time the correcting and phase shifting circuit 1000 uses to produce the CLK output signal with a given phase shift (e.g., phase shift of ninety (90) or substantially ninety degrees). The Fout signal input into the digital circuit 308 on signal line 1004 has a phase shift of ninety (90) degrees (or substantially ninety degrees) and the CLK input signal input into the digital circuit 308 on signal line 230 has a phase shift of zero (or substantially zero) degrees.

The LDO circuit 1006 is operably connected between a voltage supply V1 (e.g., VDD) and the DCCPS circuit 102 (e.g., an input of the VCDL circuit 204). The LDO circuit 1006 regulates a voltage signal that is output on signal line 1008 and input into the VCDL circuit 204. The LDO circuit 1006 operates as the power supply for the VCDL circuit 204 but the amount of delay produced by the VCDL circuit 204 is controlled by the error amplifier circuit 208. In some embodiments, the LDO circuit 1006 improves the power sensitive rejection ratio (PSRR) of the VCDL circuit 204. Any suitable LDO circuit 1006 can be used.

Figure 11:
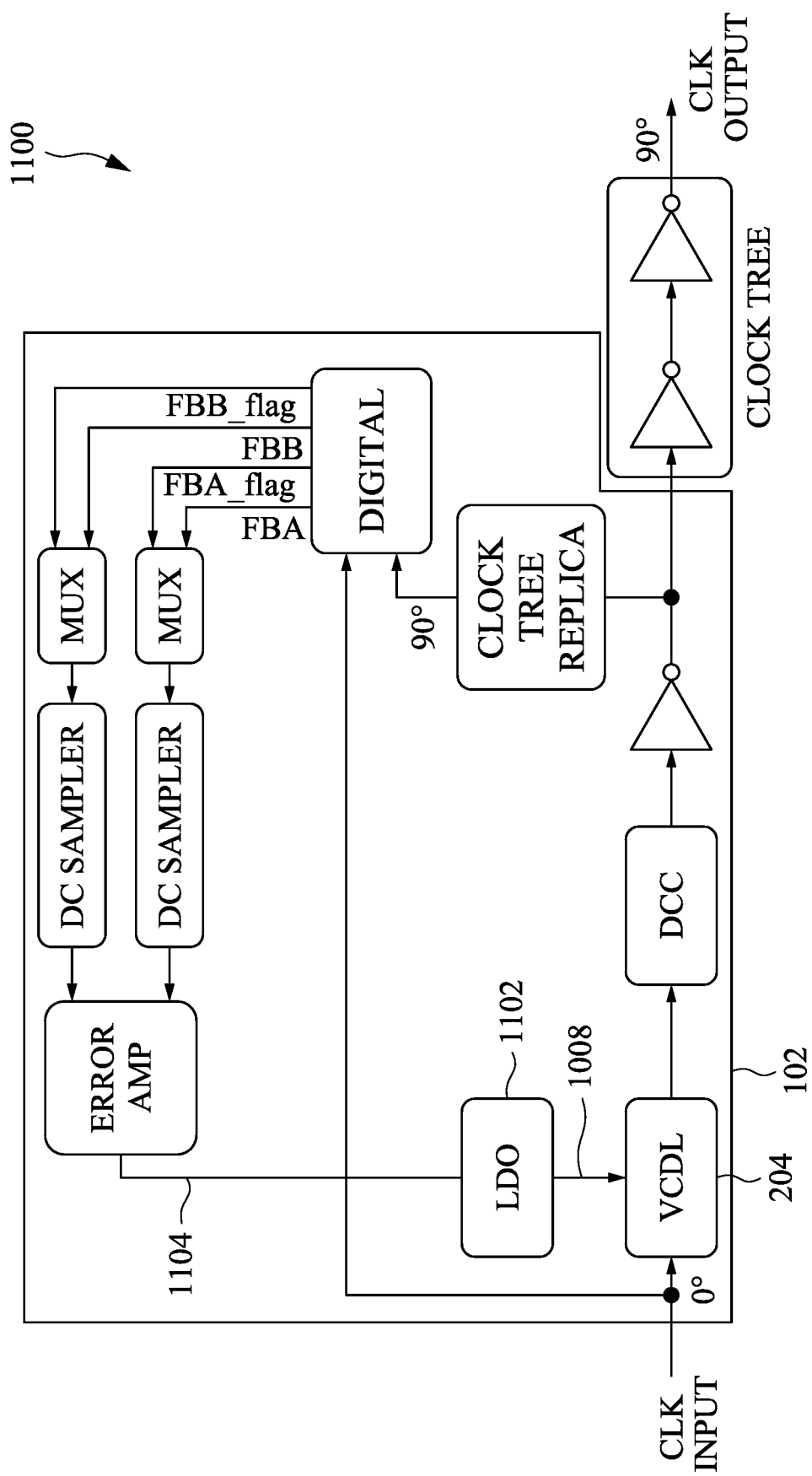
FIG. 11 illustrates a block diagram of a fifth example of a duty-cycle correcting and phase shifting circuit in accordance with some embodiments.

FIG. 11 illustrates a block diagram of a fifth example of a duty-cycle correcting and phase shifting circuit in accordance with some embodiments. The duty-cycle correcting and phase shifting circuit 1100 is similar to the duty-cycle correcting and phase shifting circuit 1000 shown in FIG. 10 except for the LDO circuit 1102. For brevity, the circuits that are depicted in both FIGS. 10 and 11 are not described again in conjunction with FIG. 11.

In the embodiment shown in FIG. 11, the DCCPS circuit 102 includes the LDO circuit 1102 operably connected between an output of the error amplifier circuit 208 and an input of the VCDL circuit 204. The LDO circuit 1102 operates as the voltage supply for the VCDL circuit 204. Any suitable LDO circuit 1102 can be used.

The error signal produced by the error amplifier circuit 208 on signal line 1104 is received by the LDO circuit 1102, which causes the voltage signal on signal line 1008 to vary. Thus, in FIG. 11, the amount of delay generated by the VCDL circuit 204 is controlled by the LDO circuit 1102, and the amount of delay varies depending on the changes in the voltage signal output from the LDO circuit 1102. In some embodiments, the LDO circuit 1102 improves the PSRR of the VCDL circuit 204.

Figure 12:
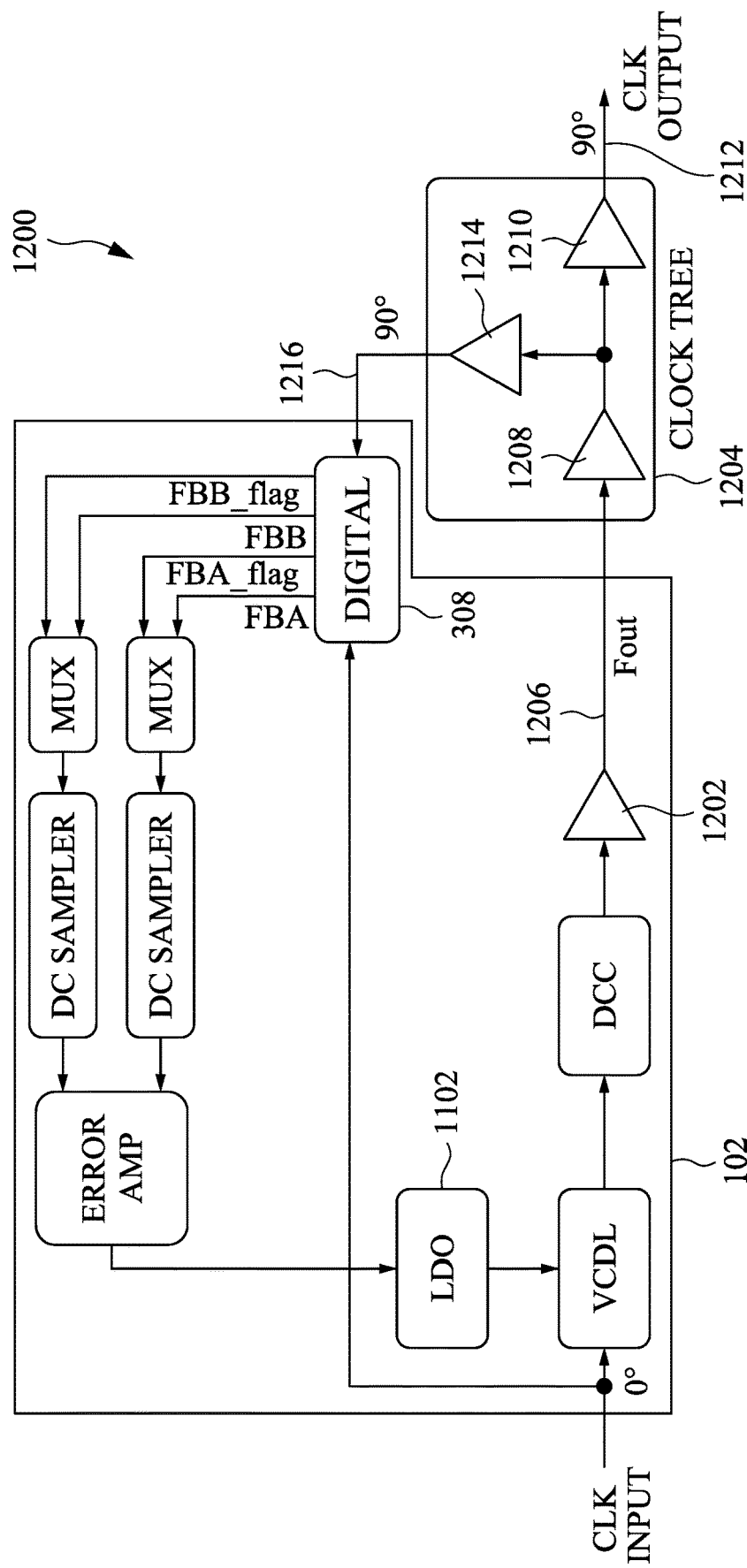
FIG. 12 illustrates a block diagram of a sixth example of a duty-cycle correcting and phase shifting circuit in accordance with some embodiments.

FIG. 12 illustrates a block diagram of a sixth example of a duty-cycle correcting and phase shifting circuit in accordance with some embodiments. The duty-cycle correcting and phase shifting circuit 1200 is similar to the duty-cycle correcting and phase shifting circuit 200 shown in FIG. 2 except for the LDO circuit 1102, the buffer circuit 1202, and the clock tree circuit 1204. For brevity, the circuits that are depicted in both FIGS. 2 and 12 are not described again in conjunction with FIG. 12.

The DCCPS circuit 102 includes the LDO circuit 1102 operably connected between an output of the error amplifier circuit 208 and an input of the VCDL circuit 204. Like FIG. 11, the LDO circuit 1102 operates as the voltage supply for the VCDL circuit 204. Any suitable LDO circuit 1102 can be used.

The inverter circuit 220 in the DCCPS circuit 102 shown in FIG. 2 is replaced with a buffer circuit 1202 in FIG. 12. The buffer circuit 1202 is operably connected between the output of the DCC circuit 206 and an input of a clock tree circuit 1204. The clock tree circuit 1204 operates as both a clock tree circuit and a clock tree replica circuit (e.g., FIG. 10). In some embodiments, the routing of the clock tree circuit 1204 is determined by an automatic place and route (APR) software application. In the embodiments shown in FIGS. 10 and 11, an APR software application can be used for the clock tree circuit 202.

The buffer circuit 1202 outputs the Fout signal on signal line 1206. The clock tree circuit 1204 includes a buffer circuit 1208 that receives the Fout signal on signal line 1206. The buffer circuit 1208 is operably connected to an input of a buffer circuit 1210. The buffer circuit 1210 outputs the CLK output signal with a given phase shift (e.g., ninety (90) degrees) on signal line 1212.

The buffer circuit 1208 is also operably connected to an input of a buffer circuit 1214. The buffer circuit 1214 outputs the Fout signal with a given phase shift (e.g., a phase shift of ninety (90) degrees) on signal line 1216. The digital circuit 308 receives the phase shifted Fout signal on signal line 1216.

Figure 13:
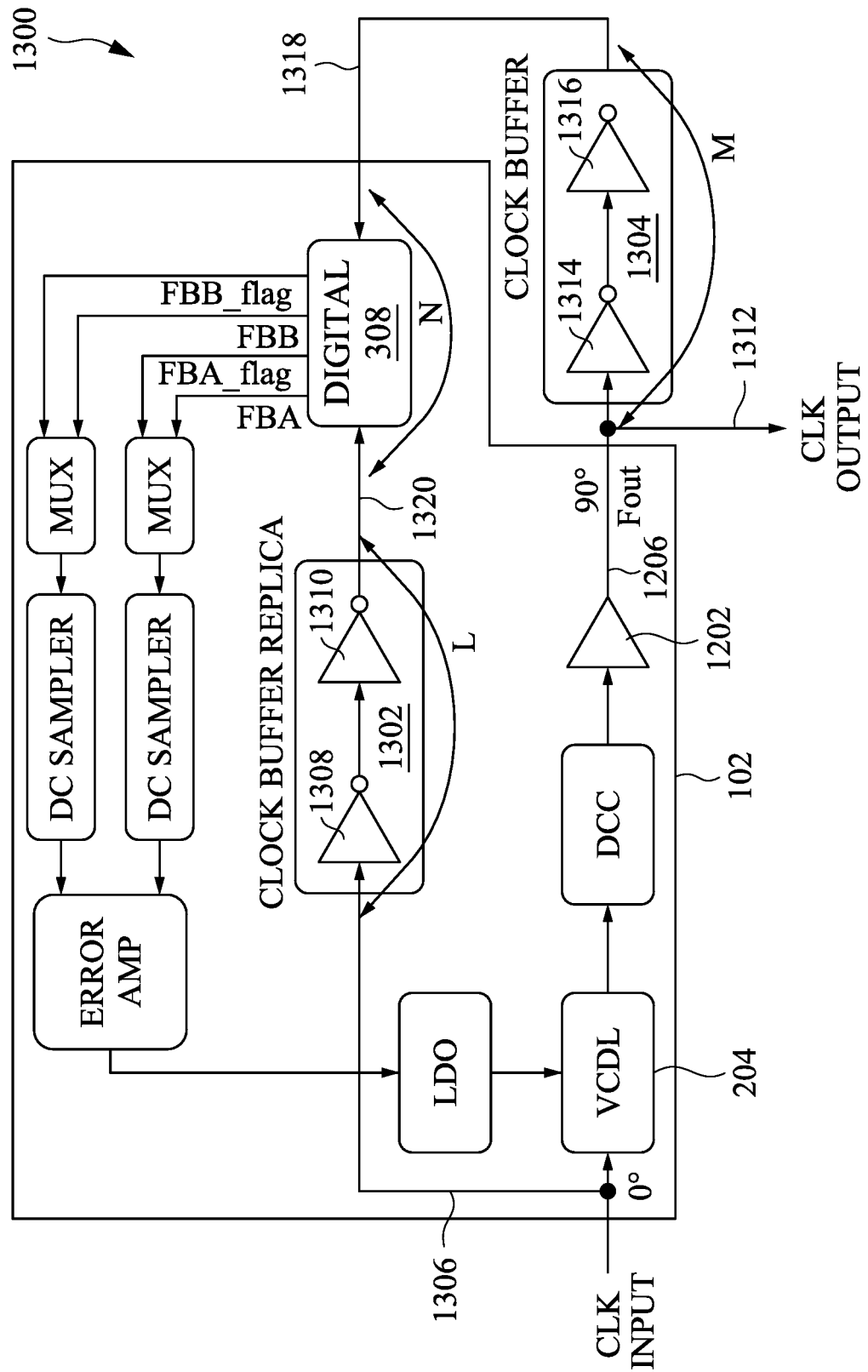
FIG. 13 illustrates a block diagram of a seventh example of a duty-cycle correcting and phase shifting circuit in accordance with some embodiments.

FIG. 13 illustrates a block diagram of a seventh example of a duty-cycle correcting and phase shifting circuit in accordance with some embodiments. The duty-cycle correcting and phase shifting circuit 1300 is similar to the duty-cycle correcting and phase shifting circuit 1200 shown in FIG. 12 except for the addition of the clock buffer replica circuit 1302 and the clock buffer circuit 1304. The clock buffer circuit 1304 replaces the clock tree circuit 1204. For brevity, the circuits that are depicted in both FIGS. 12 and 13 are not described again in conjunction with FIG. 13.

The DCCPS circuit 102 includes the clock buffer replica circuit 1302 operably connected between the input of the VCDL circuit 204 and an input of the digital circuit 308.

Thus, the clock buffer replica circuit 1302 receives the CLK input signal on signal line 1306. In the illustrated embodiment, the clock buffer replica circuit 1302 is implemented as an inverter circuit 1308 connected in series with an inverter circuit 1310. Other embodiments are not limited to this implementation, and any suitable clock buffer replica circuit can be used.

The clock buffer circuit 1304 is operably connected to an output of the buffer circuit 1202 and an input to the digital circuit 308. The Fout signal on signal line 1206 has a given phase shift (e.g., ninety (90) degrees) from the CLK input signal, and the Fout signal is output from the DCCPS circuit 102 as the CLK output signal on signal line 1312. Like the clock buffer replica circuit 1302, the clock buffer circuit 1304 is implemented with two inverter circuits 1314, 1316 connected in series. The constructions of the clock buffer replica circuit 1302 and the clock buffer circuit 1304 are the same in the embodiment shown in FIG. 13.

The signal output from the clock buffer circuit 1304 on signal line 1318 has a phase difference of L from the Fout signal. The signal output from the clock buffer replica circuit 1302 on signal line 1320 has a phase difference of M from the CLK input signal. The phase differences L and M can each be any suitable phase difference.

The clock buffer circuit 1304 balances the trace between the CLK input signal on signal line 1306 and signal line 1320 input to the digital circuit 308. Thus, the input signals received by the digital circuit 308 on signal lines 1318, 1320 have a combined phase difference of N that produces a given phase shift (e.g., ninety (90) degrees) at the digital circuit 308. When combined, the phase differences L, M of the signals on signal lines 1318, 1320, respectively, produce the given phase shift (e.g., ninety (90) degrees) at the digital circuit 308. For example, when the signal on signal line 1320 has a phase shift of ten (10) degrees and the signal on signal line 1318 has a phase shift of one hundred (100) degrees, the combined phase shift is ninety (90) degrees (e.g., the phase difference N is ninety degrees).

Figure 14:
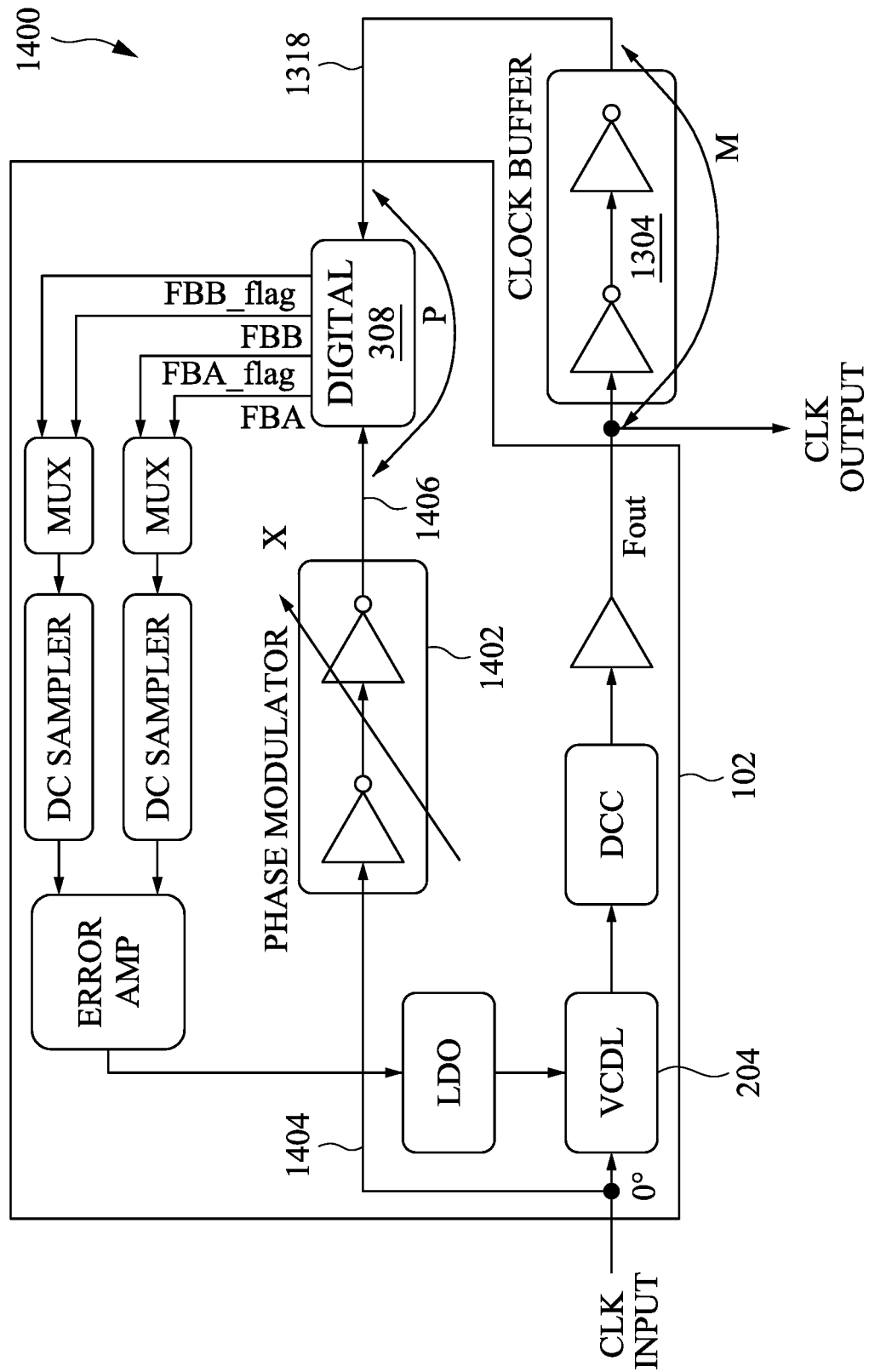
FIG. 14 illustrates a block diagram of an eighth example of a duty-cycle correcting and phase shifting circuit in accordance with some embodiments.

FIG. 14 illustrates a block diagram of an eighth example of a duty-cycle correcting and phase shifting circuit in accordance with some embodiments. The duty-cycle correcting and phase shifting circuit 1400 is similar to the duty-cycle correcting and phase shifting circuit 1300 shown in FIG. 13 except for the phase modulator circuit 1402. The phase modulator circuit 1402 replaces the clock buffer replica circuit 1302. For brevity, the circuits that are depicted in both FIGS. 13 and 14 are not described again in conjunction with FIG. 14.

The DCCPS circuit 102 includes the phase modulator circuit 1402 operably connected between the input of the VCDL circuit 204 and an input of the digital circuit 308. Thus, the phase modulator circuit 1402 receives the CLK input signal on signal line 1404 and modulates the phase of the CLK output signal. In the illustrated embodiment, the phase modulator circuit 1402 and the clock buffer circuit 1304 are constructed with the same components (e.g., two inverter circuits connected in series), but other embodiments can implement the phase modulator circuit 1402 and the clock buffer circuit 1304 with different components or with a different number of components (e.g., two inverter circuits in the phase modulator circuit 1402 and four inverter circuits in the clock buffer circuit 1304).

The signal output from the clock buffer circuit 1304 on signal line 1318 has a phase difference of M from the Fout signal. The signal output from the phase modulator circuit 1402 on signal line 1406 has a phase difference of X from the CLK input signal. The phase differences M and X can be any suitable phase differences.

The input signals received by the digital circuit 308 on signal lines 1318, 1406 have a combined phase difference of P, where P equals or substantially equals a given phase shift (e.g., ninety (90) degrees). The phase shift X produced by the phase modulator circuit 1402 for the signal on signal line 1406 is based on the given phase difference P and the value of the phase difference M. For example, when P is to be ninety (90) degrees and M equals one hundred and ten (110) degrees, the phase modulator circuit 1402 produces a phase shift of twenty (20) degrees in the signal on signal line 1406. The difference between the one hundred ten (110) degree phase difference and the twenty (20) degree phase difference is ninety (90) degrees.

Figure 15:
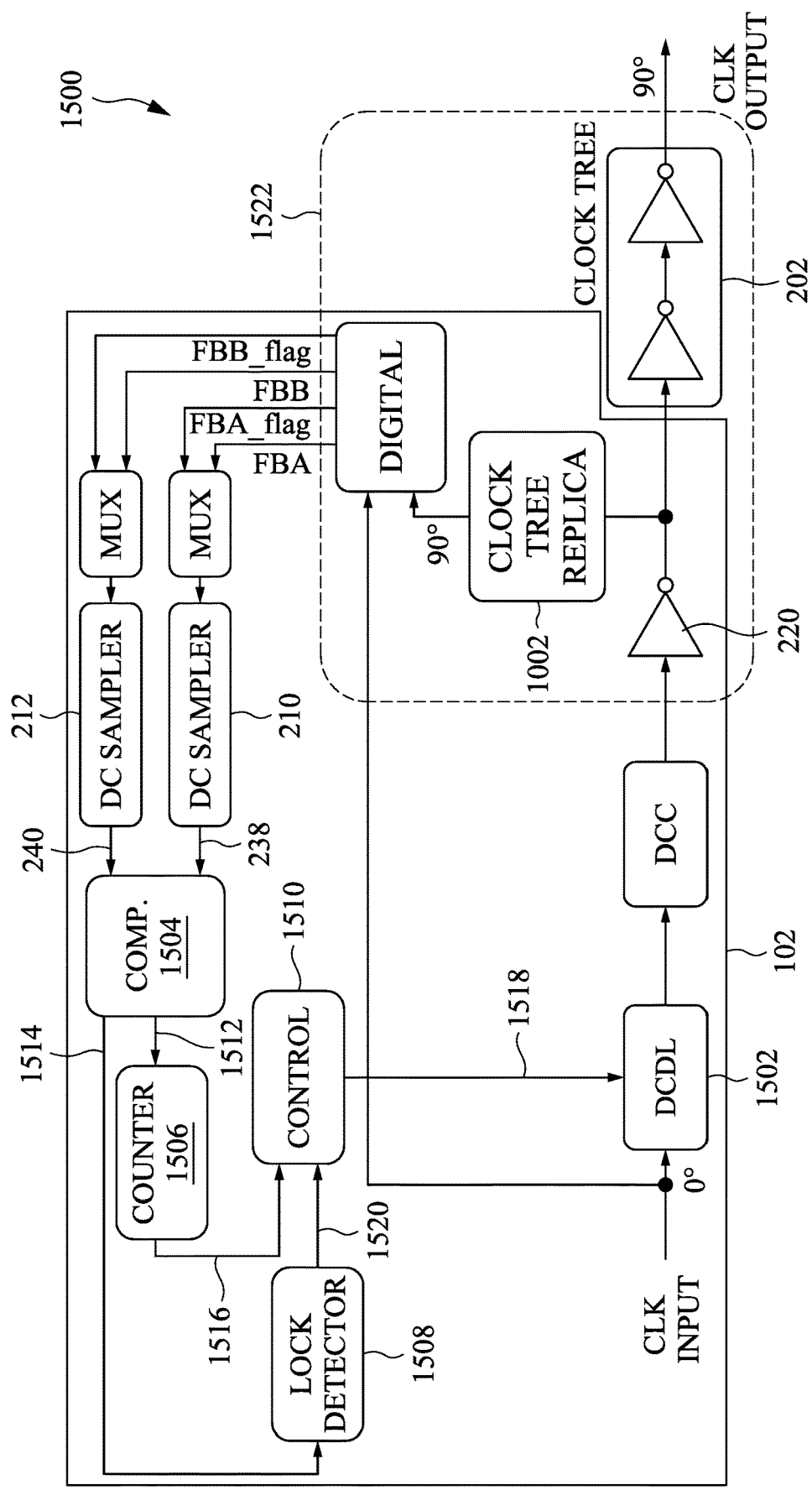
FIG. 15 illustrates a block diagram of a ninth example of a duty-cycle correcting and phase shifting circuit in accordance with some embodiments.

FIG. 15 illustrates a block diagram of a ninth example of a duty-cycle correcting and phase shifting circuit in accordance with some embodiments. The duty-cycle correcting and phase shifting circuit 1500 is a digital version of a duty-cycle correcting and phase shifting circuit. The duty-cycle correcting and phase shifting circuit 1500 is similar to the duty-cycle correcting and phase shifting circuit 1000 shown in FIG. 10 except for the digital-controlled delay line (DCDL) circuit 1502, the comparator circuit 1504, the counter circuit 1506, the lock detector circuit 1508, and the control circuit 1510. The DCDL circuit 1502 replaces the VCDL circuit 204. The comparator circuit 1504, the counter circuit 1506, the lock detector circuit 1508, and the control circuit 1510 replace the error amplifier circuit 208. For brevity, the circuits that are depicted in both FIGS. 10 and 15 are not described again in conjunction with FIG. 15.

The comparator circuit 1504 receives DC voltage signals from the DC sampler circuits 210, 212 on signal lines 238, 240, respectively, and compares the DC voltage signals. When one of the DC voltage signals (e.g., the DC voltage signal on signal line 240) is less than the other DC voltage signal, the comparator circuit 1504 outputs a zero (0) on signal lines 1512, 1514. When a DC voltage signal (e.g., the DC voltage signal on signal line 240) is greater than the other DC voltage signal, the comparator circuit 1504 outputs a one (1) on signal lines 1512, 1514.

The counter circuit 1506 receives the output from the comparator circuit 1504 on signal line 1512 and counts the one (1) output. The counter circuit 1506 outputs a count signal on signal line 1516 that is received by the control circuit 1510. The control circuit 1510 outputs a control signal on signal line 1518 that controls the amount of delay that is generated by the DCDL circuit 1502.

The lock detector circuit 1508 receives the signal output from the comparator circuit 1504 on signal line 1514 and analyzes the signal level of the received signal. When the signal level of the signal output from the comparator circuit 1504 repeatedly alternates between zero (0) and one (1), the lock signal output by the lock detector circuit 1508 on signal line 1520 transitions to a high level, which causes the control signal output on signal line 1518 to remain a constant output (e.g., the signal level of the control signal does not change). At this point, the DCDL circuit 1502 produces a constant amount of delay.

In one embodiment, the clock tree replica circuit 1002, the inverter circuit 220, and the clock tree circuit 202 highlighted in the dashed box 1522 can be replaced with the buffer circuit 1202 and the clock tree circuit 1204 shown in FIG. 12. In another embodiment, the clock tree replica circuit 1002, the inverter circuit 220, and the clock tree circuit 202 highlighted in the dashed box 1522 may be replaced with the buffer circuit 1202 and the clock buffer circuit 1304 shown in FIG. 13. In such embodiments, the DCCPS circuit 102 can further include the clock buffer replica circuit 1302 (FIG. 13) or the phase modulator circuit 1402 (FIG. 14).

Figure 16:
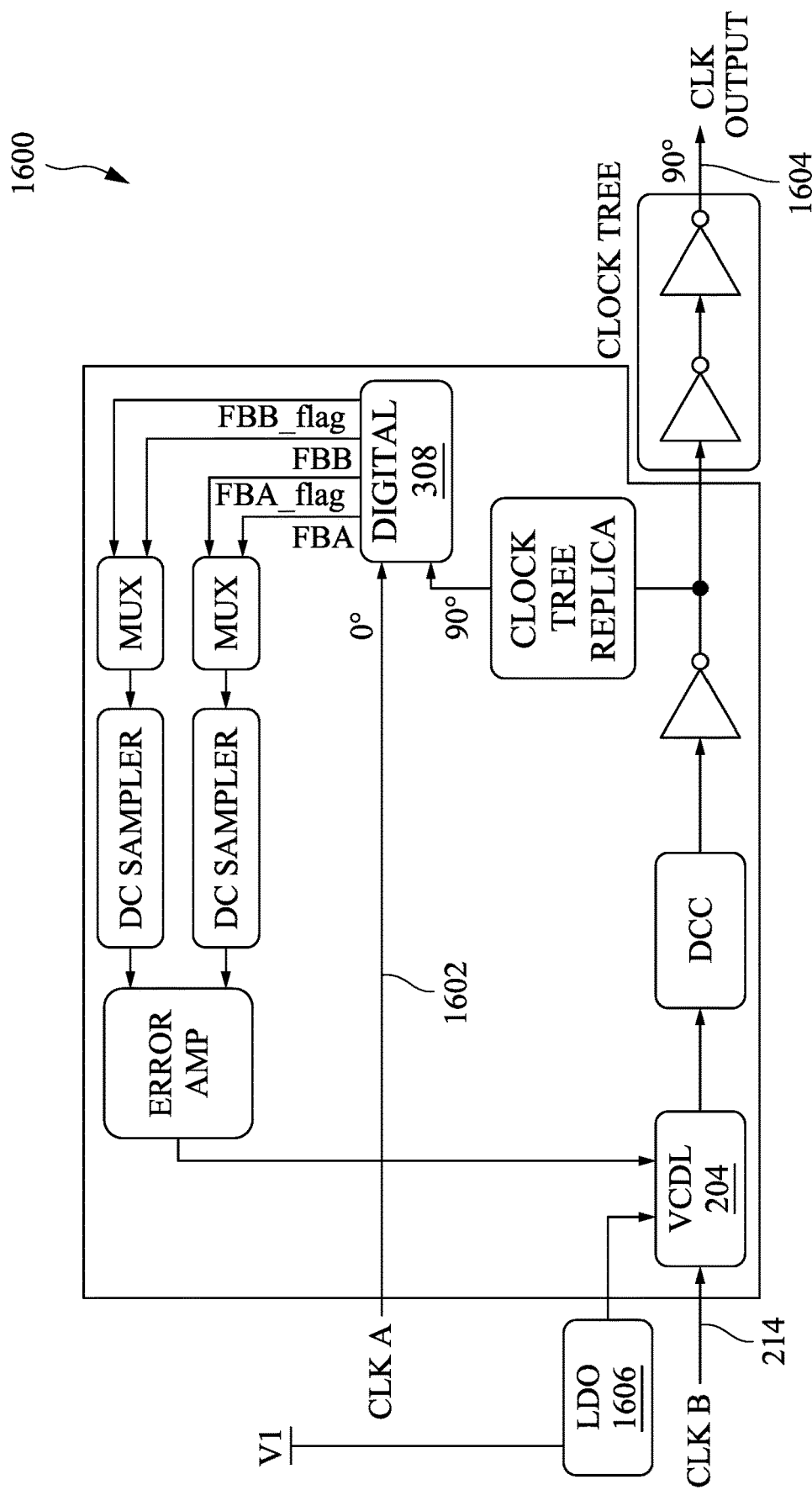
FIG. 16 illustrates a block diagram of a tenth example of a duty-cycle correcting and phase shifting circuit in accordance with some embodiments.

FIG. 16 illustrates a block diagram of a tenth example of a duty-cycle correcting and phase shifting circuit in accordance with some embodiments. The duty-cycle correcting and phase shifting circuit 1600 is similar to the duty-cycle correcting and phase shifting circuit 1000 shown in FIG. 10, except for the clock input signals CLK A and CLK B. For brevity, the circuits that are depicted in both FIGS. 10 and 16 are not described again in conjunction with FIG. 16.

The duty-cycle correcting and phase shifting circuit 1600 is operable to lock the CLK A signal and the CLK B signal at a given phase shift, such as a ninety (90) degree phase shift (or a substantially ninety degree phase shift). The digital circuit 308 receives the CLK A signal on signal line 1602 and the VCDL circuit 204 receives the CLK B signal on signal line 214. In the illustrated embodiment, the CLK output signal on signal line 1604 is not locked into the given phase shift (e.g., ninety (90) degrees) with respect to a CLK input signal.

In the illustrated embodiment, the LDO circuit 1606 is operably connected between a voltage supply V1 (e.g., VDD) and an input of the VCDL circuit 204. Accordingly, the LDO circuit 1606 is configured similar to the LDO circuit 1006 shown in FIG. 10. In other embodiments, the LDO circuit 1606 can be arranged similarly to the LDO circuit 1102 as shown in FIG. 11.

Figure 17:
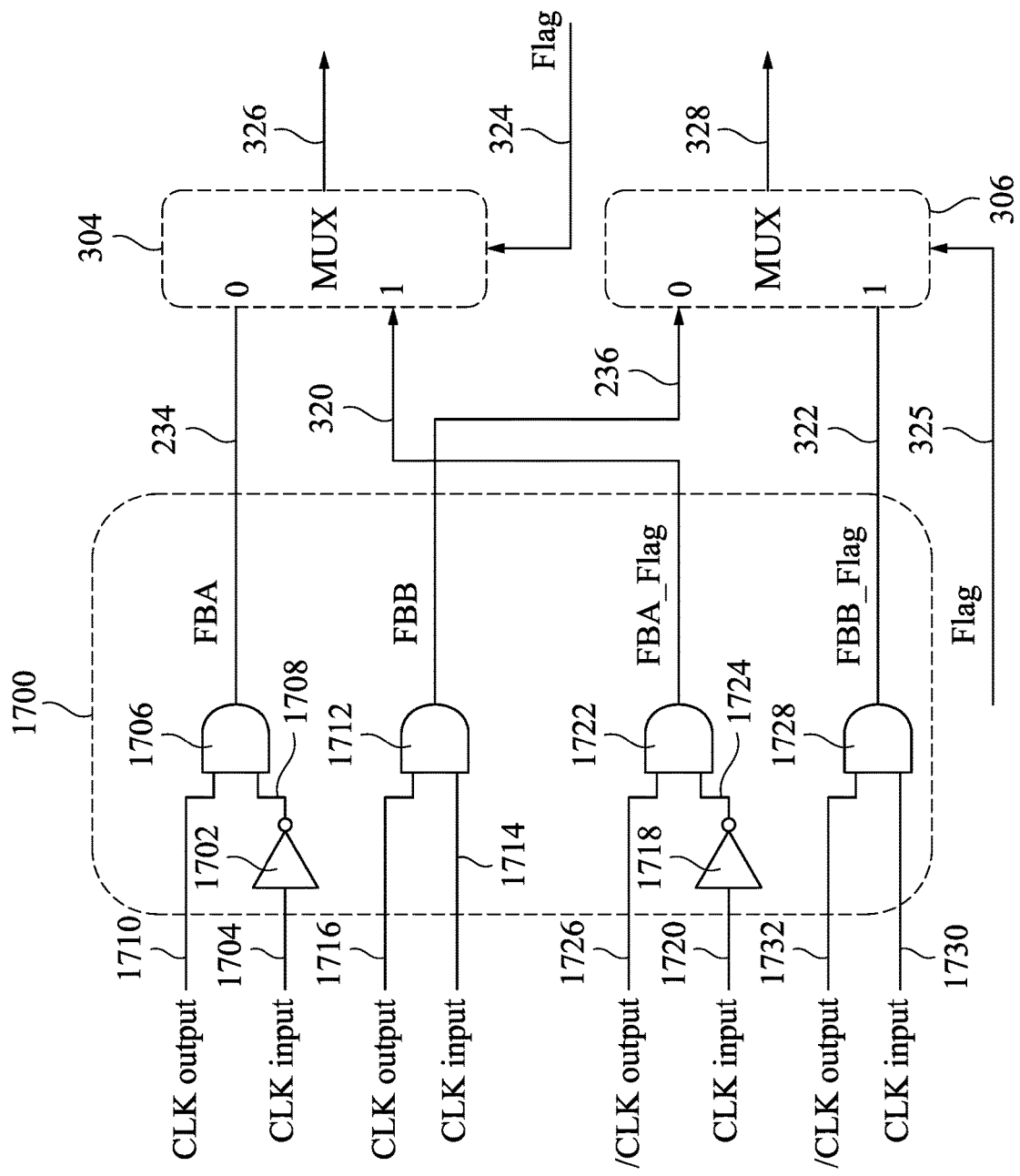
FIG. 17 illustrates a schematic diagram of an example digital circuit that is operable to lock two input clock signals at a phase difference of two hundred and seventy degrees in accordance with some embodiments.

In other embodiments, the CLK input signal and the CLK output signal can be locked into a phase shift other than ninety (90) degrees. For example, in one embodiment, the CLK input and the CLK output signals can be locked into a phase difference of two hundred and seventy (270) degrees. FIG. 17 illustrates a schematic diagram of an example digital circuit that is operable to lock two input clock signals at a phase difference of two hundred and seventy degrees in accordance with some embodiments.

The digital circuit 1700 is operable to output the FBA, FBA_flag, FBB, and FBB flag signals. The digital circuit 1700 is operably connected to the select circuits 304, 306. The FBA and the FBA_flag signals are input into the select circuit 304 on signal lines 234, 320, respectively. The FBB and the FBB flag signals are input into the select circuit 306 on signal lines 236, 322, respectively. To generate the FBA signal, the CLK input signal is input into an inverter circuit 1702 on signal line 1704. The inverted CLK output signal is input into the AND gate 1706 on signal line 1708. The CLK output signal is input into the AND gate 1706 on signal line 1710. The FBA signal is output from the AND gate 1706 on signal line 234.

To generate the FBB signal, the CLK input signal is input into an AND gate 1712 on signal line 1714, and the CLK output signal is input into the AND gate 1712 on signal line 1716. The FBB signal is output from the AND gate 1712 on signal line 236.

To generate the FBA_flag signal, the CLK input signal is input into an inverter circuit 1718 on signal line 1720. The inverted CLK output signal is input into the AND gate 1722 on signal line 1724. The /CLK output signal is input into the AND gate 1722 on signal line 1726. The FBA_flag signal is output from the AND gate 1722 on signal line 320.

To generate the FBB flag signal, the CLK input signal is input into an AND gate 1728 on signal line 1730, and the /CLK output signal is input into the AND gate 1728 on signal line 1732. The FBB flag signal is output from the AND gate 1728 on signal line 322.

The states of the FBA, FBB, FBA_flag, and FBB flag signals output from the digital circuit 1700 are shown in Table 2. Like Table 1, the "X" in Table 2 indicates a "do not care" state that is based on the signal level of the Flag signal.

TABLE 2

| CLK OUT | /CLK OUT | CLK IN | FBA Flag = 0 | FBB Flag = 0 | FBA_FLAG Flag = 1 | FBB_FLAG Flag = 1 |
|---|---|---|---|---|---|---|
| 0 | 1 | 0 | X | X | 1 | 0 |
| 0 | 1 | 1 | X | X | 0 | 1 |
| 1 | 0 | 0 | 1 | 0 | X | X |
| 1 | 0 | 1 | 0 | 1 | X | X |

The states of the FBA and the FBB signals depend on the states of the CLK output and CLK input signals. The states of the FBA_flag and FBB flag signals depend on the states of the /CLK output and CLK input signals. Depending on the state of the flag signal that is input into the select circuits 304, 306 on signal lines 324, 325, respectively, the select circuit 304 outputs either the FBA or the FBA_flag signal and the select circuit 306 outputs either the FBB or the FBB flag signal. For example, when the flag signal is at a low signal level, the FBA signal is output from the select circuit 304 on signal line 326 and the FBB signal is output from the select circuit 306 on signal line 328. When the flag signal is at a high signal level, the FBA_flag signal is output from the select circuit 304 on signal line 326 and the FBB flag signal is output from the select circuit 306 on signal line 328.

Figure 18:
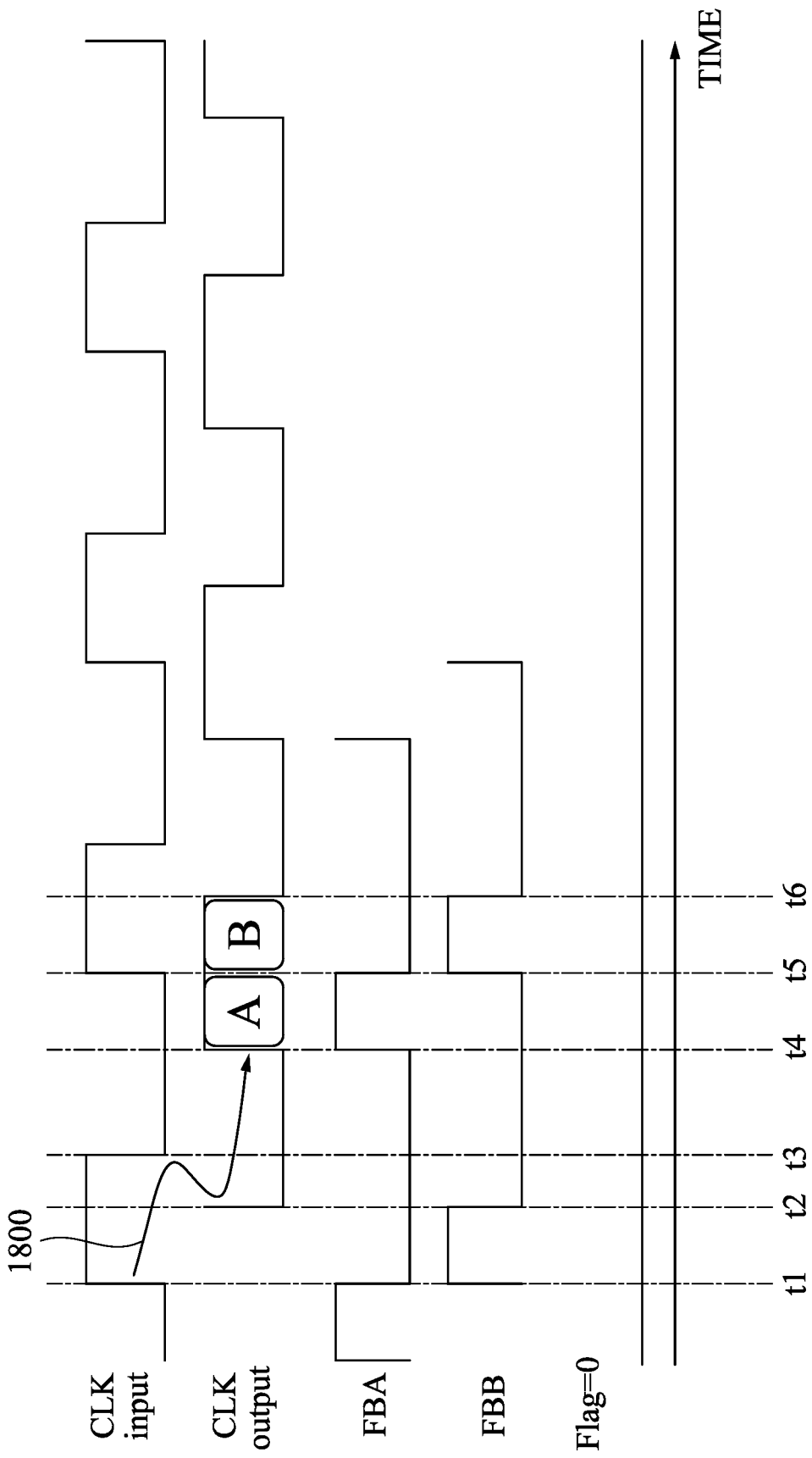
FIG. 18 illustrates an example first timing diagram for a duty-cycle correcting and phase shifting circuit that is operable to produce a phase shift of two hundred and seventy degrees between an input clock and an output clock in accordance with some embodiments.

FIG. 18 illustrates an example first timing diagram for a duty-cycle correcting and phase shifting circuit that is operable to produce a phase shift of two hundred and seventy degrees between an input clock and an output clock in accordance with some embodiments. In the representative timing diagram, the CLK input signal has a duty cycle of forty percent (40%), the CLK output signal has a duty cycle of fifty percent (50%), and the frequency of the clock is two (2) GHz.

The rising edge of the CLK input signal occurs at time t1 and the falling edge of the CLK output signal occurs at time t2. The time t2 occurs at the midpoint (or substantially at the midpoint) of the pulse width of the CLK input signal. In the example timing diagram, the midpoint of the pulse width of the CLK input signal occurs between time t1 and time t3. Accordingly, the CLK output signal is phase shifted two hundred and seventy (270) degrees (or substantially two hundred and seventy degrees) from the CLK input signal (represented by the arrow 1800). When the CLK output signal is phase shifted two hundred and seventy (270) degrees, or substantially two hundred and seventy degrees, from the CLK input signal, the area of section A of the CLK output signal located between times t4 and t5 equals (or substantially equals) the area of section B of the CLK output signal (located between times t5 and t6).

In FIG. 18, the duty-cycle correcting and phase shifting circuit (e.g., FIG. 3A) is locked in a two hundred and seventy (270) degree (or substantially two hundred and seventy degree) phase shift and the Flag signal is at a low signal level. Accordingly, the CLK output signal is selected as the output clock signal (e.g., select circuit 302 in FIG. 3A). Since the CLK output signal is phase shifted two hundred and seventy (270) from the CLK input signal, the pulse widths of the FBA and the FBB signals are equal. When the duty-cycle correcting and phase shifting circuit (e.g., FIG. 3A) is locked in a ninety (90) degree (or substantially ninety degree) phase shift and the Flag signal is at a high signal level, the CLK output signal is selected as the output clock signal.

Figure 19:
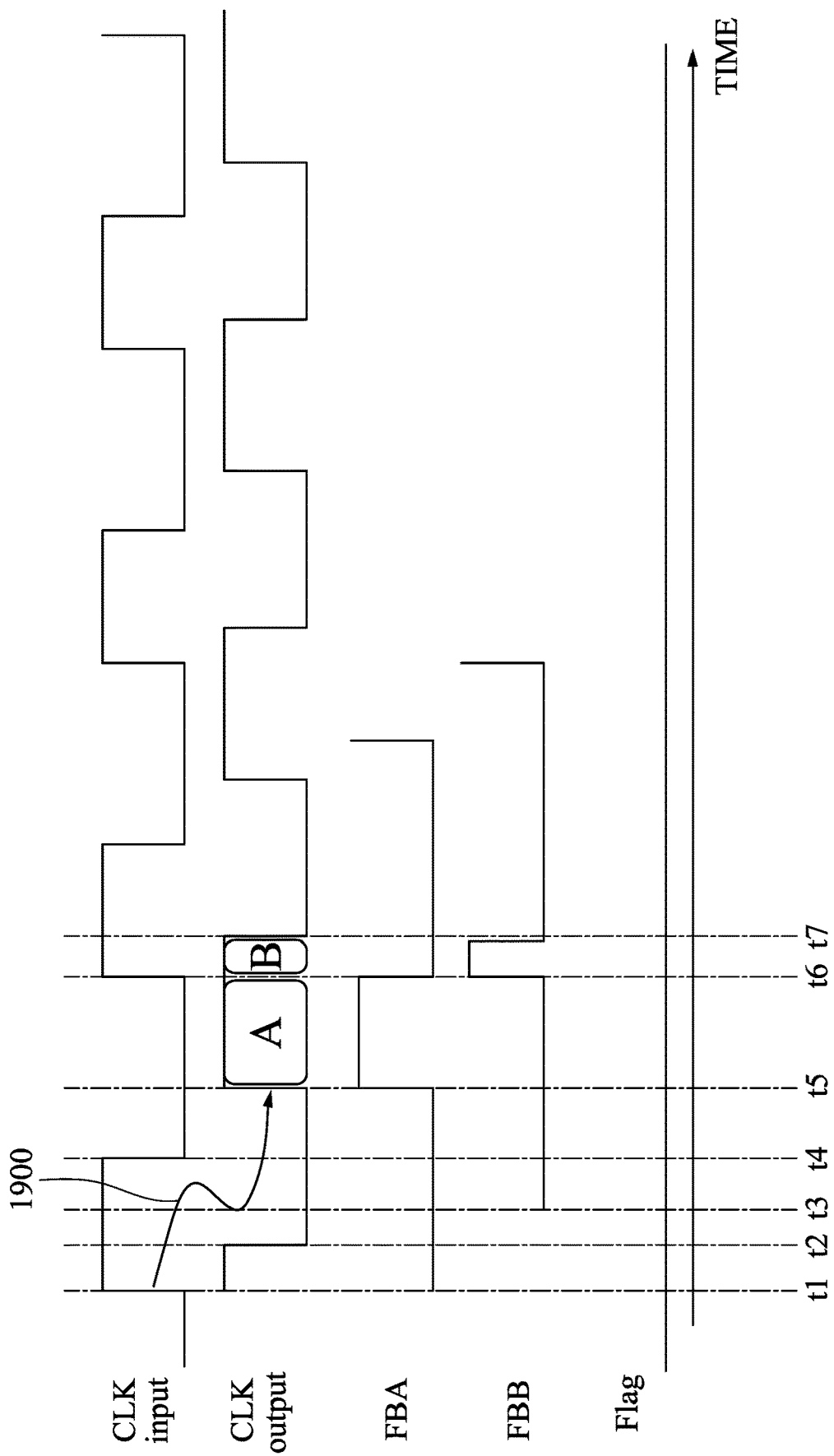
FIG. 19 illustrates an example second timing diagram for a duty-cycle correcting and phase shifting circuit that is operable to produce a phase shift of two hundred and seventy degrees between an input clock and an output clock in accordance with some embodiments.

FIG. 19 illustrates an example second timing diagram for a duty-cycle correcting and phase shifting circuit that is operable to produce a phase shift of two hundred and seventy degrees between an input clock and an output clock in accordance with some embodiments. In the representative timing diagram, the CLK input signal has a duty cycle of forty percent (40%), the CLK output signal has a duty cycle of fifty percent (50%), and the frequency of the clock is two (2) GHz. The rising edge of the CLK input signal occurs at time t1 and the falling edge of the CLK output signal occurs at time t2. In FIG. 19, the time t2 occurs before time t3, where time t3 is located at the midpoint of the pulse width of the CLK input signal. In the example timing diagram, the midpoint of the pulse width of the CLK input signal occurs between time t1 and time t4. Thus, the phase shift between the rising edge of the CLK input signal (time t1) and the rising edge of the CLK output signal (time t5) is less than two hundred and seventy (270) degrees (represented by the arrow 1900), and the area of section A of the CLK output signal located between times t5 and t6 is greater than the area of section B of the CLK output signal (located between times t6 and t7).

The amount of delay produced by the VCDL circuit (e.g., 204 in FIG. 3A) is increased when the phase shift is less than two hundred and seventy (270) degrees. The DC sampler circuits (e.g., 210, 212 in FIG. 3A) translate the pulse widths of the FAA and the FBB signals into DC voltage signals that are received by the error amplifier circuit (e.g., 208 in FIG. 3A). The error signal output by the error amplifier circuit causes the VCDL circuit to increase the amount of delay in the received CLK input signal until the phase shift between the CLK input and the CLK output signals is two hundred and seventy (270) degrees or is substantially two hundred and seventy degrees (e.g., the pulse widths of the FBA and the FBB signals are equal or substantially equal).

Figure 20:
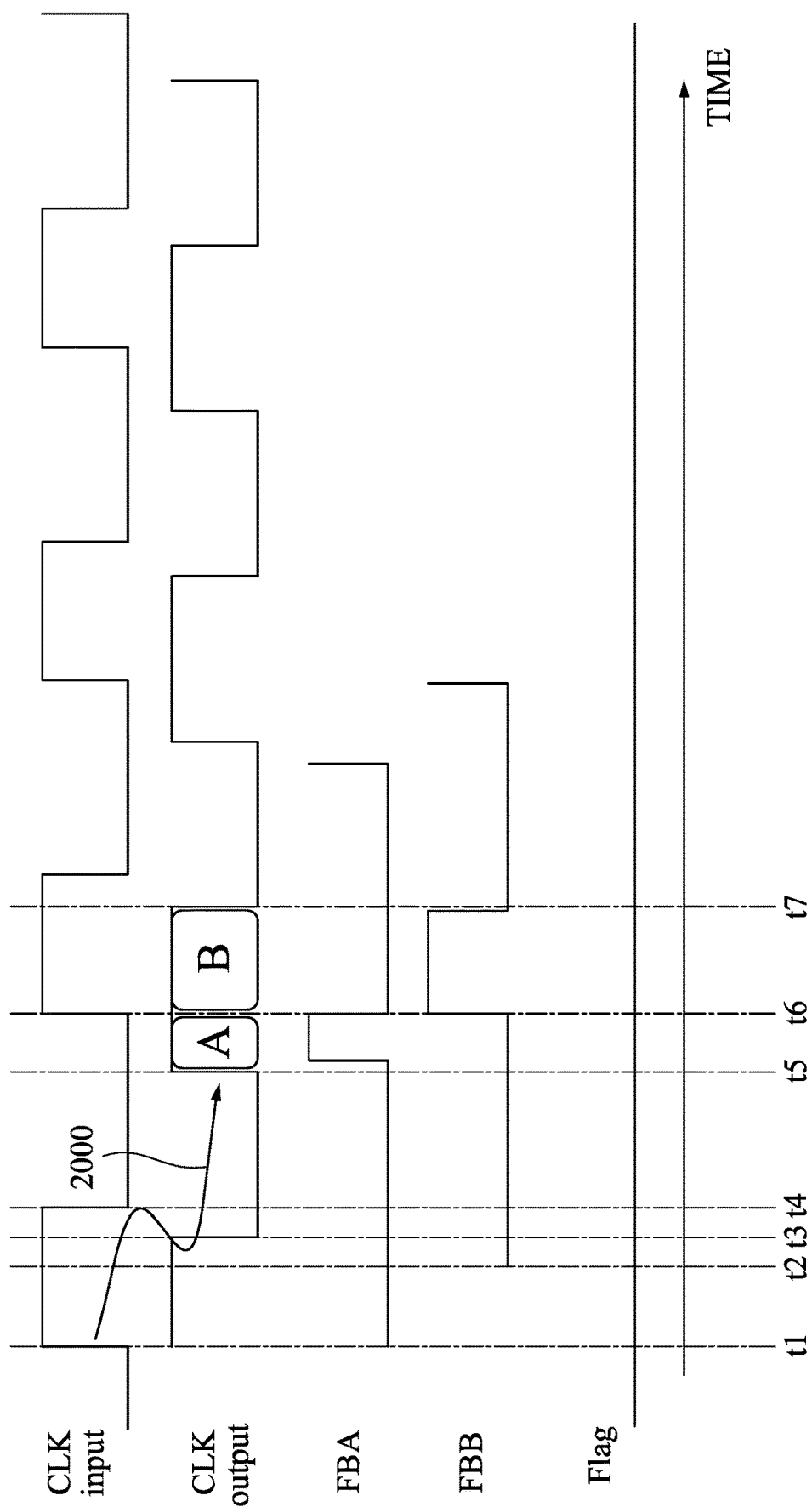
FIG. 20 illustrates an example third timing diagram for a duty-cycle correcting and phase shifting circuit that is operable to produce a phase shift of two hundred and seventy degrees between an input clock and an output clock in accordance with some embodiments.

FIG. 20 illustrates an example third timing diagram for a duty-cycle correcting and phase shifting circuit that is operable to produce a phase shift of two hundred and seventy degrees between an input clock and an output clock in accordance with some embodiments. In the representative timing diagram, the CLK input signal has a duty cycle of forty percent (40%), the CLK output signal has a duty cycle of fifty percent (50%), and the frequency of the clock is two (2) GHz. The rising edge of the CLK input signal occurs at time t1 and the falling edge of the CLK output signal occurs at time t3. In FIG. 20, the time t3 occurs after time t2, where time t2 is located at the midpoint of the pulse width of the CLK input signal. In the example timing diagram, the midpoint of the pulse width of the CLK input signal occurs between time t1 and time t4. Thus, the phase shift between the rising edge of the CLK input signal (time t1) and the rising edge of the CLK output signal (time t5) is greater than two hundred and seventy (270) degrees (represented by the arrow 2000), and the area of section A of the CLK output signal located between times t5 and t6 is less than the area of section B of the CLK output signal (located between times t6 and t7).

The amount of delay produced by the VCDL circuit (e.g., 204 in FIG. 3A) is decreased when the phase shift is greater than two hundred and seventy (270) degrees. The DC sampler circuits (e.g., 210, 212 in FIG. 3A) translate the pulse widths of the FAA and the FBB signals into DC voltage signals that are received by the error amplifier circuit (e.g., 208 in FIG. 3A). The error signal output by the error amplifier circuit causes the VCDL circuit to decrease the amount of delay in the received CLK input signal until the phase shift between the CLK input and the CLK output signals is two hundred and seventy (270) degrees or substantially two hundred and seventy degrees (e.g., the pulse widths of the FBA and the FBB signals are equal or substantially equal).

Figure 21:
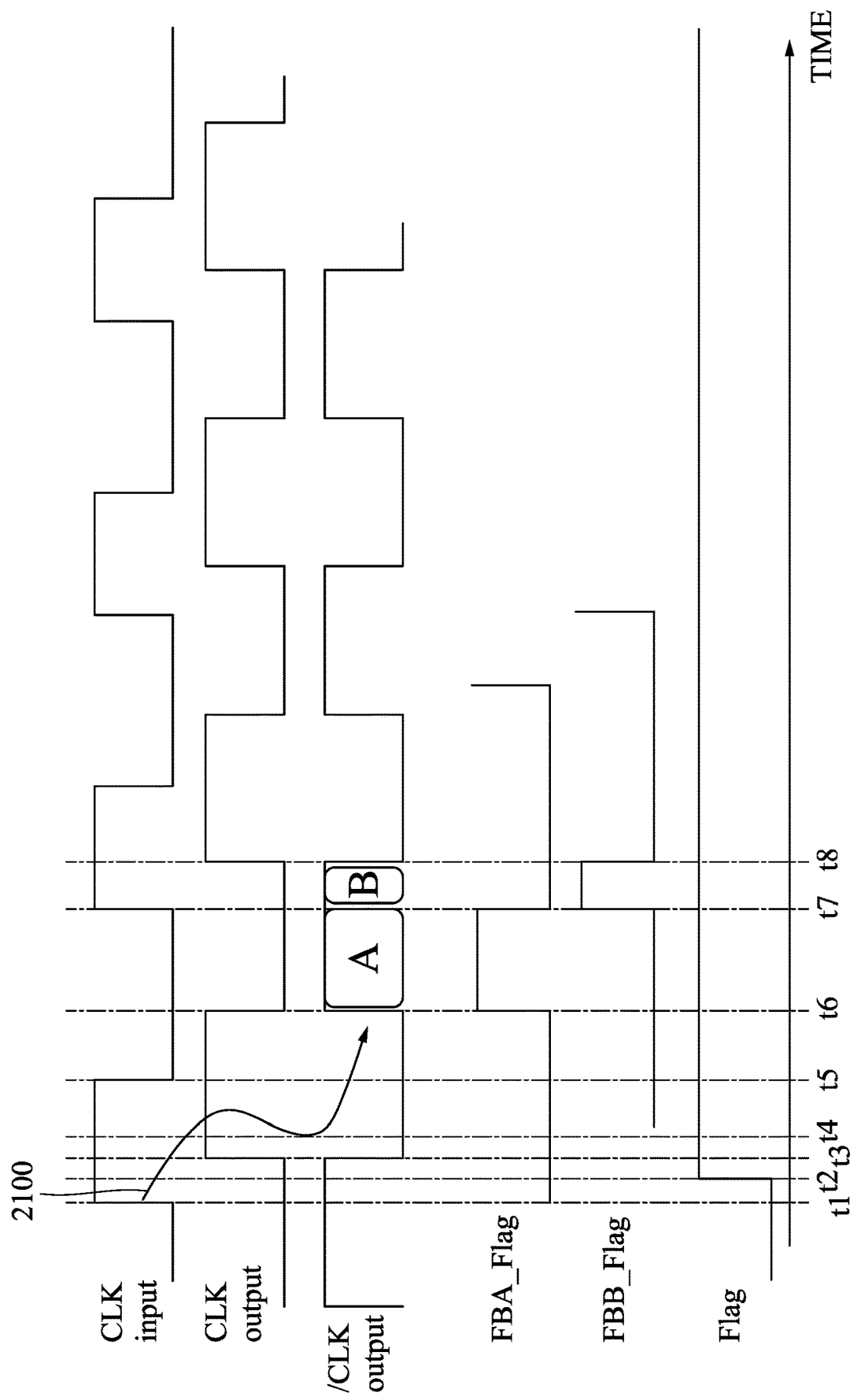
FIG. 21 illustrates an example fourth timing diagram for a duty-cycle correcting and phase shifting circuit that is operable to produce a phase shift of two hundred and seventy degrees between an input clock and an output clock in accordance with some embodiments.

FIG. 21 illustrates an example fourth timing diagram for a duty-cycle correcting and phase shifting circuit that is operable to produce a phase shift of two hundred and seventy degrees between an input clock and an output clock in accordance with some embodiments. In the representative timing diagram, the CLK input signal has a duty cycle of forty percent (40%), the CLK output signal has a duty cycle of fifty percent (50%), and the frequency of the clock is two (2) GHz. The rising edge of the CLK input signal occurs at time t1, the rising edge of the CLK output signal occurs at time t3, and the falling edge of the /CLK output signals occur at time t3. In FIG. 21, the time t3 occurs before time t4, where time t4 is located at the midpoint of the pulse width of the CLK input signal. In the example timing diagram, the midpoint of the pulse width of the CLK input signal occurs between time t1 and time t5. Thus, the phase shift between the rising edge of the CLK input signal (time t1) and the rising edge of the /CLK output signal (time t6) is less than two hundred and seventy (270) degrees (represented by the arrow 2100), and the area of section A of the CLK output signal located between times t6 and t7 is greater than the area of section B of the CLK output signal (located between times t7 and t8).

At time t2, the Flag signal transitions to a high level, which causes the select circuit 302 to select the /CLK output signal as the output clock signal. Also, based on the high signal level of the Flag signal, the FBA_flag signal is output from the select circuit 304 and the FBB flag signal is output from the select circuit 306. The amount of delay produced by the VCDL circuit (e.g., 204 in FIG. 3A) is increased when the phase shift is less than two hundred and seventy (270) degrees. The DC sampler circuits (e.g., 210, 212 in FIG. 3A) translate the pulse widths of the FBA_flag and the FBB flag signals into DC voltage signals that are received by the error amplifier circuit (e.g., 208 in FIG. 3A). The error signal output by the error amplifier circuit causes the VCDL circuit to increase the amount of delay in the received CLK input signal until the phase shift between the CLK input and the /CLK output signals is two hundred and seventy (270) degrees or substantially two hundred and seventy degrees (e.g., the pulse widths of the FBA_flag and the FBB flag signals are equal or substantially equal).

Figure 22:
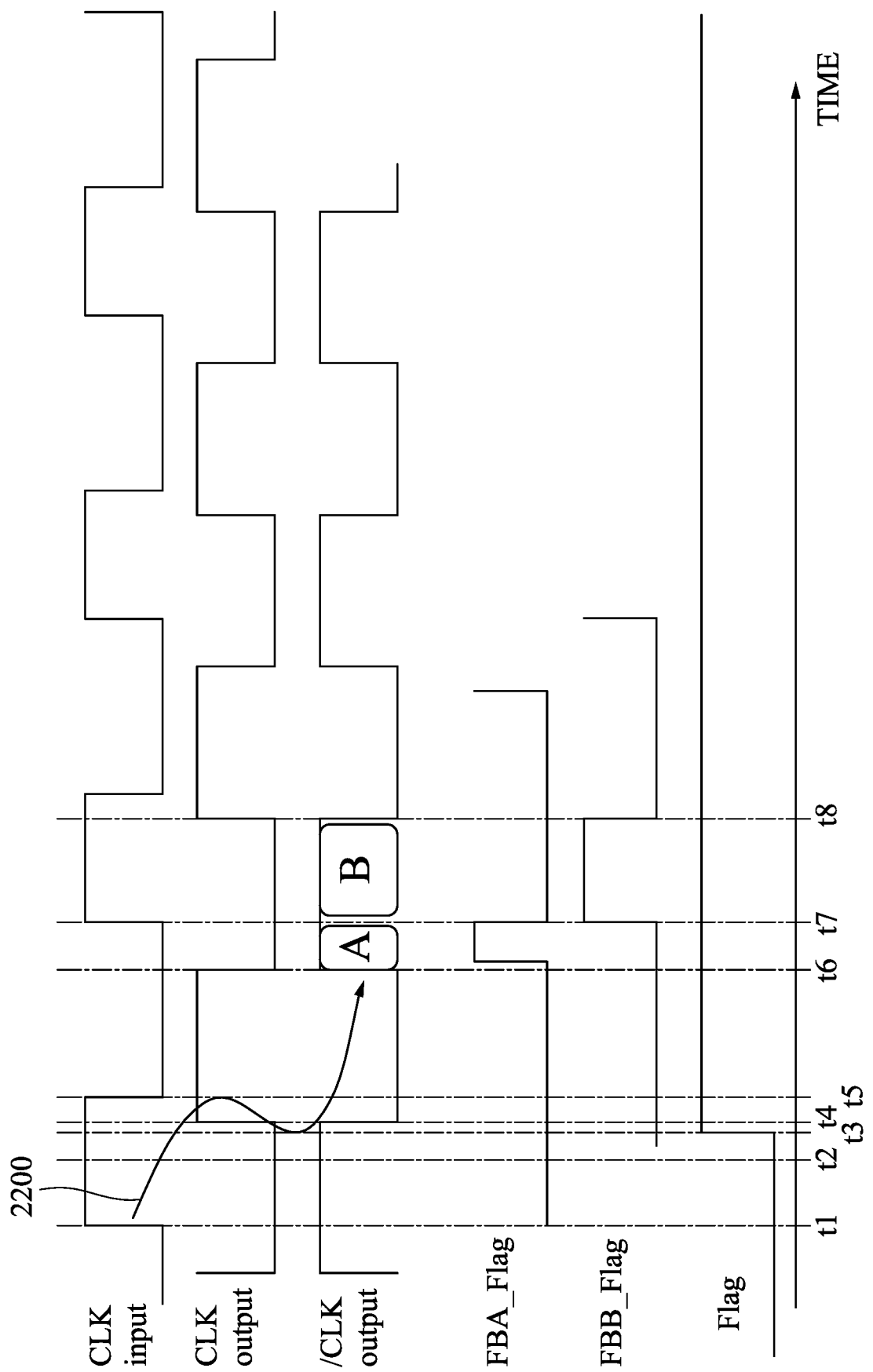
FIG. 22 illustrates an example fifth timing diagram for a duty-cycle correcting and phase shifting circuit that is operable to produce a phase shift of two hundred and seventy degrees between an input clock and an output clock in accordance with some embodiments.

FIG. 22 illustrates an example fifth timing diagram for a duty-cycle correcting and phase shifting circuit that is operable to produce a phase shift of two hundred and seventy degrees between an input clock and an output clock in accordance with some embodiments. In the representative timing diagram, the CLK input signal has a duty cycle of forty percent (40%), the CLK output signal has a duty cycle of fifty percent (50%), and the frequency of the clock is two (2) GHz. The rising edge of the CLK input signal occurs at time t1, the rising edge of the CLK output signal occurs at time t4, and the falling edge of the /CLK output signals occur at time t4. In FIG. 22, the time t4 occurs after time t2, where time t2 is located at the midpoint of the pulse width of the CLK input signal (midpoint between times t1 and t5). Thus, the phase shift between the rising edge of the CLK input signal (time t1) and the rising edge of the /CLK output signal (time t6) is greater than two hundred and seventy (270) degrees (represented by the arrow 2200), and the area of section A of the CLK output signal located between times t6 and t7 is less than the area of section B of the CLK output signal (located between times t7 and t8).

At time t3, the Flag signal transitions to a high level, which causes the select circuit 302 to select the /CLK output signal as the output clock signal. Also, based on the high signal level of the Flag signal, the FBA_flag signal is output from the select circuit 304 and the FBB flag signal is output from the select circuit 306. The amount of delay produced by the VCDL circuit (e.g., 204 in FIG. 3A) is decreased when the phase shift is greater than two hundred and seventy (270) degrees. The DC sampler circuits (e.g., 210, 212 in FIG. 3A) translate the pulse widths of the FBA_flag and the FBB flag signals into DC voltage signals that are received by the error amplifier circuit (e.g., 208 in FIG. 3A). The error signal output by the error amplifier circuit causes the VCDL circuit to decrease the amount of delay in the received CLK input signal until the phase shift between the CLK input and the /CLK output signals is two hundred and seventy (270) degrees or substantially two hundred and seventy degrees (e.g., the pulse widths of the FBA_flag and the FBB flag signals are equal or substantially equal).

Figure 23:
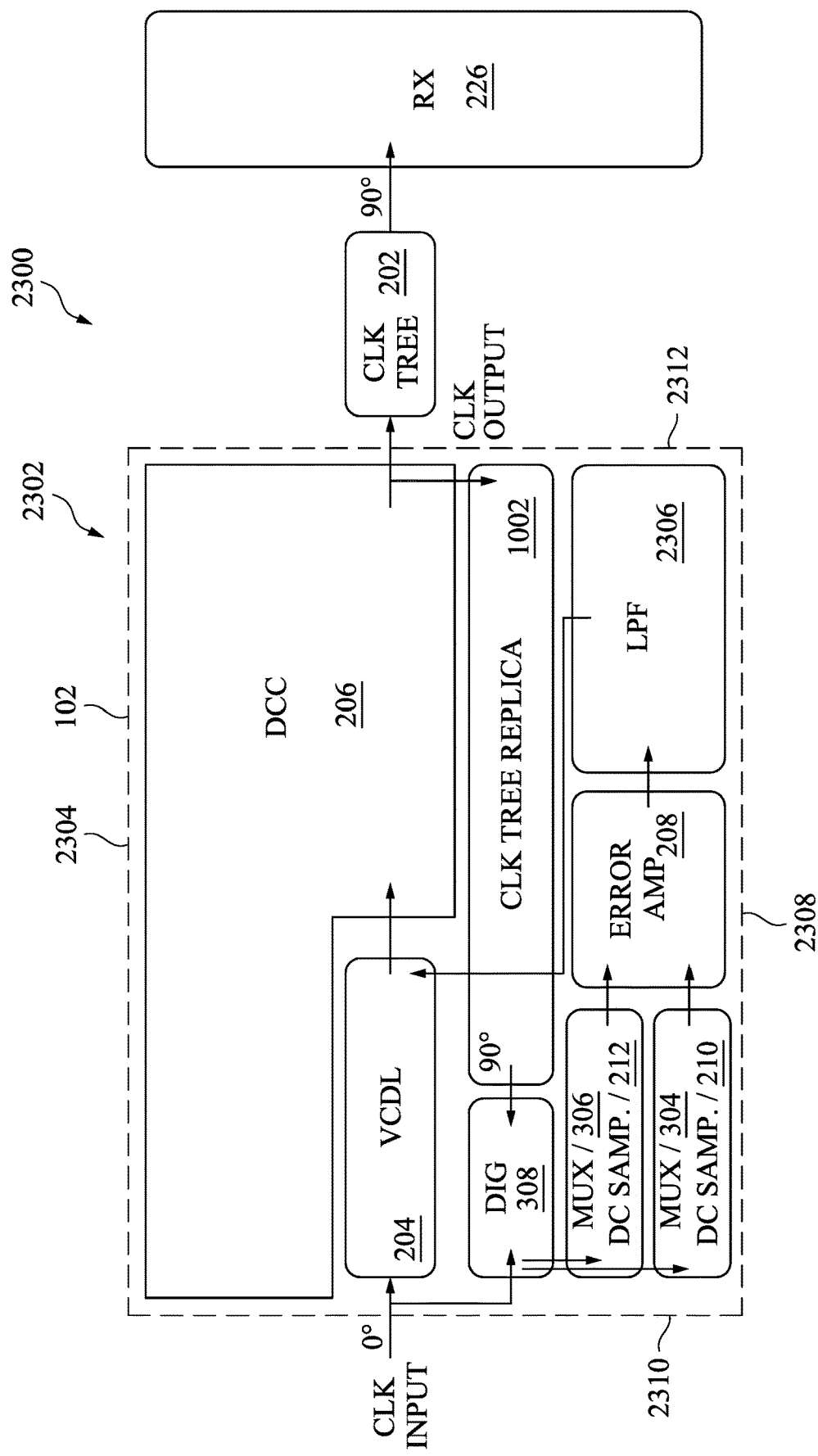
FIG. 23 illustrates an example layout for the duty-cycle correcting and phase shifting circuit shown in FIGS. 10 and 11 in accordance with some embodiments.

FIG. 23 illustrates an example layout for the duty-cycle correcting and phase shifting circuit shown in FIGS. 10 and 11 in accordance with some embodiments. The layout 2300 includes a layout of the DCCPS circuit 102, the clock tree circuit 202, and the receiver circuit 226. The DCCPS circuit 102 is laid out in a cell 2302. The DCC circuit 206 is positioned adjacent and along the edge 2304 of the cell 2302. The select circuit (MUX) 304 and the DC sampler circuit 210 are positioned at the corner of the cell 2302 along the edges 2308, 2310. A low pass filter (LPF) circuit 2306 is positioned in the corner of the cell 2302 adjacent the edges 2308, 2312. In one embodiment, the LPF circuit 2306 is the LPF circuit 340 shown in FIG. 3C.

The error amplifier circuit 208 is positioned along the edge 2308 between the select circuit 304/DC sampler circuit 210 and the LPF circuit 2306. The select circuit (MUX) 306 and the DC sampler 212 are positioned along the edge 2310 and between the digital circuit 308 and the select circuit (MUX) 304/DC sampler circuit 210. The clock tree replica circuit 1002 is positioned along the edge 2312 between the error amplifier circuit 208, the LPF circuit 2306, and the DCC circuit 206. The digital circuit 308 is positioned along the edge 2310 and between the select circuit (MUX) 306/DC sampler circuit 212 and the VCDL circuit 204, and adjacent the clock tree replica circuit 1002. The VCDL circuit 204 is positioned along the edge 2310 and between the DCC circuit 206 and the digital circuit 308. The clock tree circuit 202 is positioned outside of the cell 2302 between the DCCPS circuit 102 and the receiver circuit 226. The arrows represent the propagation directions of the signals.

Figure 24:
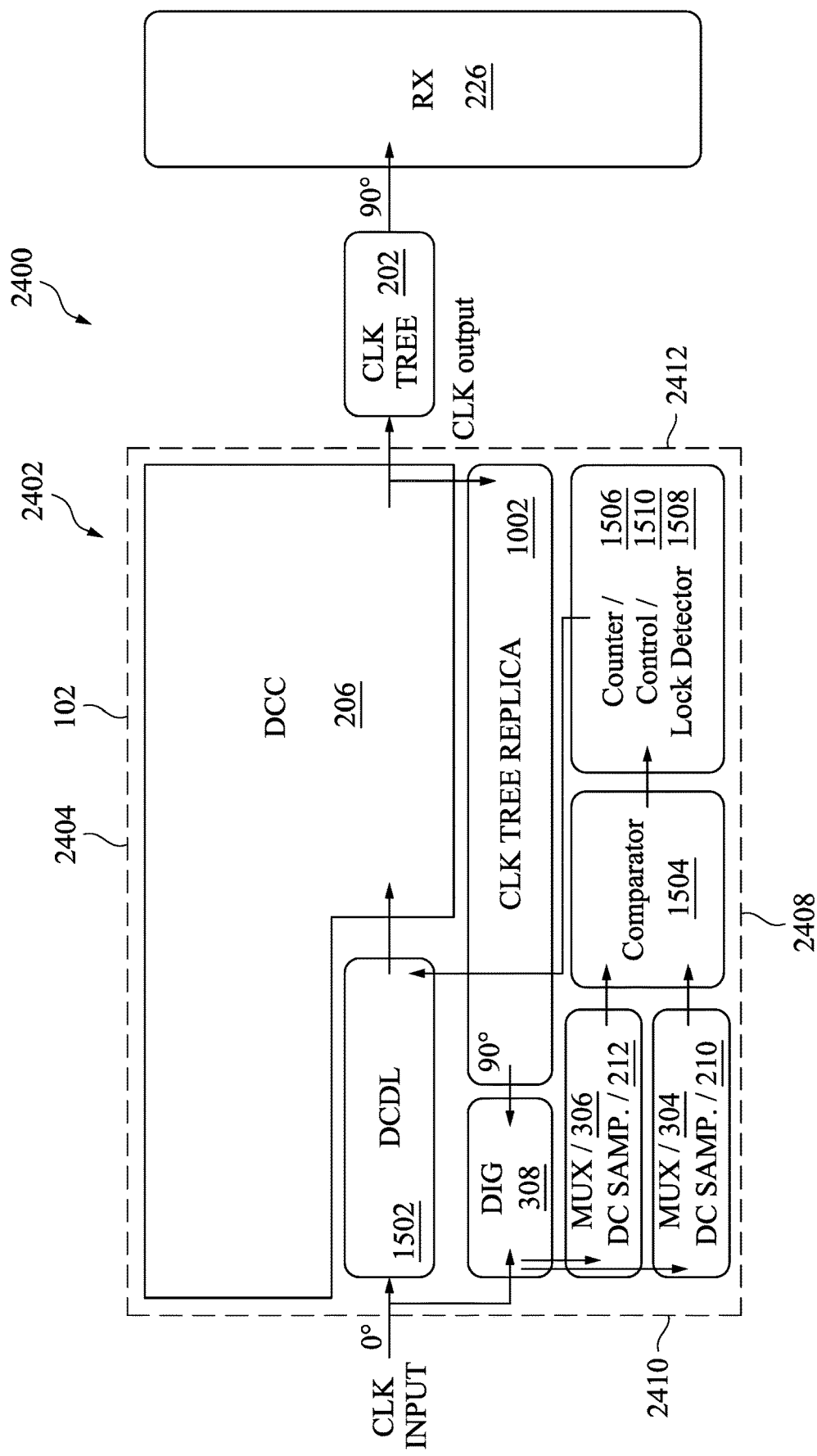
FIG. 24 illustrates an example layout for the duty-cycle correcting and phase shifting circuit shown in FIG. 15 in accordance with some embodiments.

FIG. 24 illustrates an example layout for the duty-cycle correcting and phase shifting circuit shown in FIG. 15 in accordance with some embodiments. The layout 2400 includes a layout of the DCCPS circuit 102, the clock tree circuit 202, and the receiver circuit 226. The DCCPS circuit 102 is laid out in a cell 2402. The DCC circuit 206 is positioned adjacent and along the edge 2404 of the cell 2402. The select circuit (MUX) 304 and the DC sampler circuit 210 are positioned at the corner of the cell 2402 along the edges 2408, 2410. The counter circuit, the control circuit, and the lock detector circuit 1506, 1510, 1508 are positioned in the corner of the cell 2402 adjacent the edges 2408, 2412.

The comparator circuit 1504 is positioned along the edge 2408 between the select circuit (MUX) 304/DC sampler circuit 210 and the counter circuit, the control circuit, and the lock detector circuit 1506, 1510, 1508. The select circuit (MUX) 306 and the DC sampler 212 are positioned along the edge 2410 between the digital circuit 308 and the select circuit (MUX) 304/DC sampler circuit 210. The clock tree replica circuit 1002 is positioned along the edge 2412 and between the comparator circuit 1504, the counter circuit, the control circuit, and the lock detector circuit 1506, 1510, 1508, and the DCC circuit 206. The digital circuit 308 is positioned along the edge 2410 and between the DCDL circuit 1502 and the select circuit (MUX) 306/DC sampler circuit 212, and adjacent the clock tree replica circuit 1002. The DCDL circuit 1502 is positioned along the edge 2410 and between the DCC circuit 206 and the digital circuit 308. The clock tree circuit 202 is positioned outside of the cell 2402 between the DCCPS circuit 102 and the receiver circuit 226. The arrows represent the propagation directions of the signals.

Figure 25:
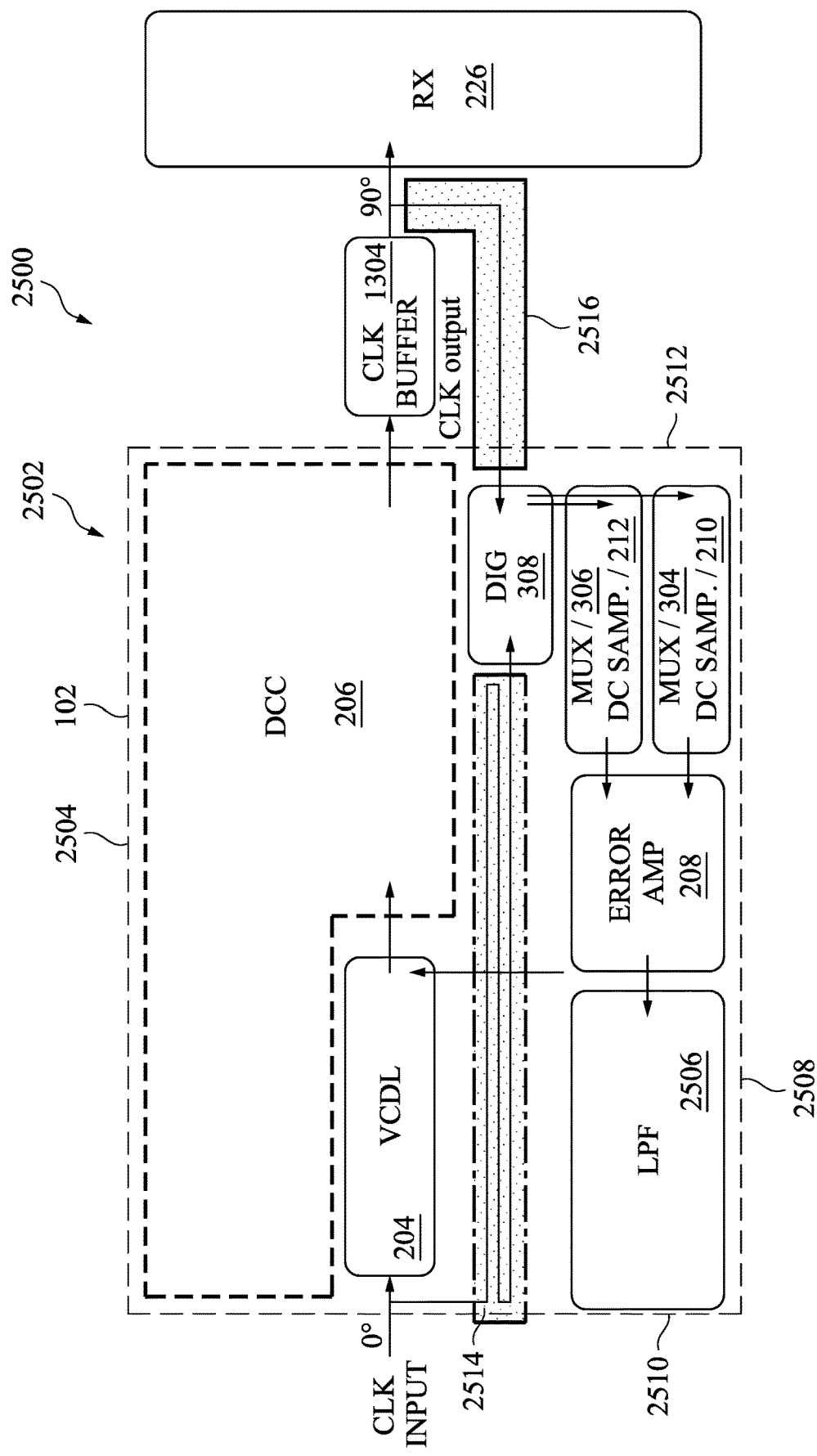
FIG. 25 illustrates an example first layout for the duty-cycle correcting and phase shifting circuit shown in FIG. 14 in accordance with some embodiments.

FIG. 25 illustrates an example layout for the correcting and phase shifting circuit shown in FIG. 14 in accordance with some embodiments. The layout 2500 includes a layout of the DCCPS circuit 102, the clock buffer circuit 1304, and the receiver circuit 226. The DCCPS circuit 102 is laid out in a cell 2502. The DCC circuit 206 is positioned adjacent and along the edge 2504 of the cell 2502. The select circuit (MUX) 304 and the DC sampler circuit 210 are positioned at the corner of the cell 2502 along the edges 2508, 2512. A low pass filter (LPF) circuit 2506 is positioned in the corner of the cell 2502 adjacent the edges 2508, 2510. In one embodiment, the LPF circuit 2506 is the LPF circuit 340 shown in FIG. 3C.

The error amplifier circuit 208 is positioned along the edge 2508 between the select circuit (MUX) 304/DC sampler circuit 210 and the LPF circuit 2506. The select circuit (MUX) 306 and the DC sampler 212 are positioned along the edge 2512 adjacent the select circuit (MUX) 304/DC sampler circuit 210. The digital circuit 308 is positioned along the edge 2512 and between the DCC circuit 206 and the select circuit (MUX) 306/DC sampler circuit 212. The VCDL circuit 204 is positioned along the edge 2510 and between the DCC circuit 206 and the LPF circuit 2506.

The trace balance 2514 (e.g., signal lines 1404, 1406 in FIG. 14) is positioned between the CLK input and the digital circuit 308 and between the VCDL circuit 204, the DCC circuit 206, the error amplifier circuit 208, and the LPF circuit 2506. The clock buffer circuit 1304 is positioned outside of the cell 2502 between the DCCPS circuit 102 and the receiver circuit 226. The trace balance 2516 (e.g., signal line 1318 in FIG. 13) is positioned between the CLK output, the digital circuit 308, and the receiver circuit 226. The arrows represent the propagation directions of the signals.

Figure 26:
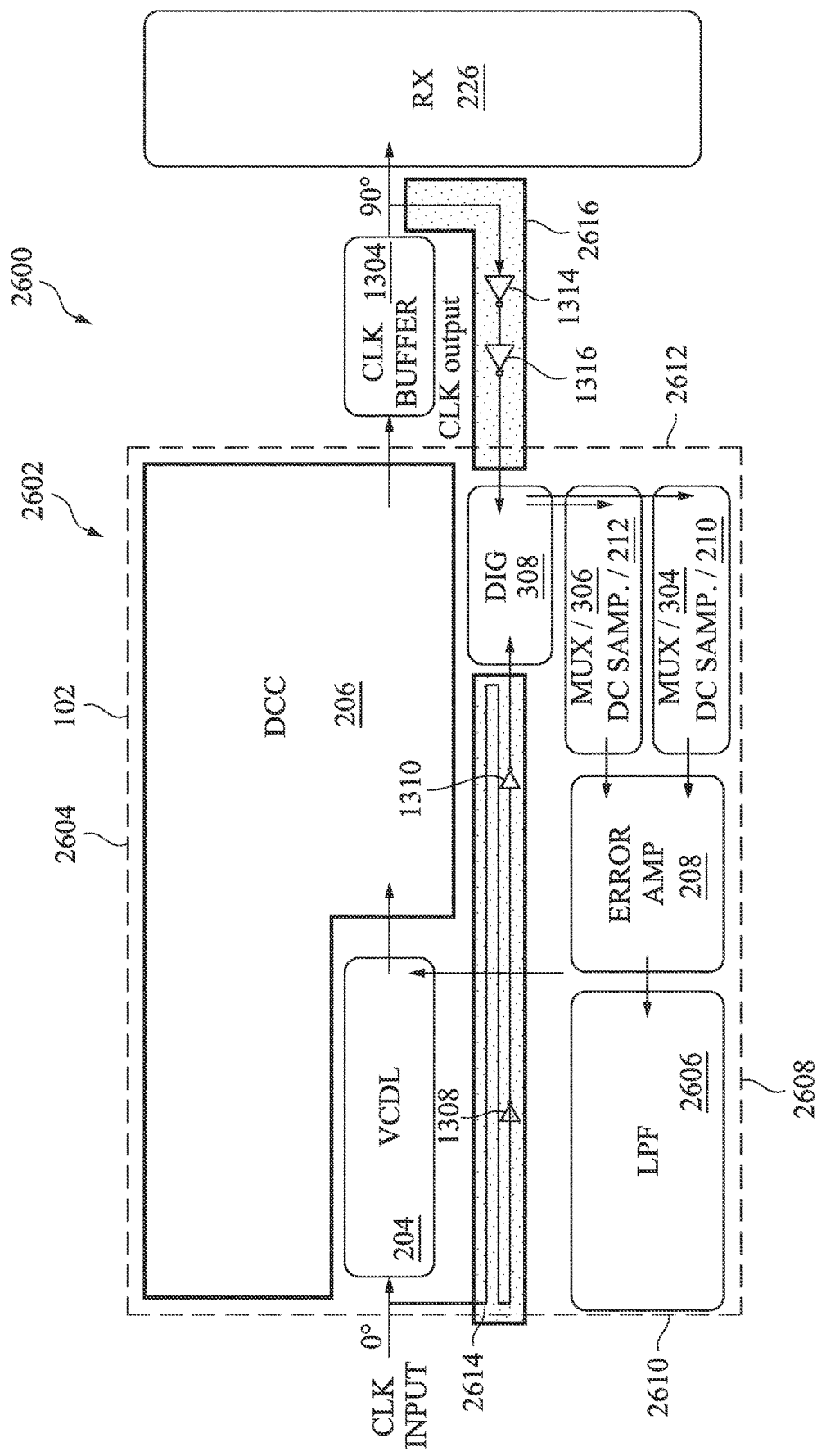
FIG. 26 illustrates an example second layout for the duty-cycle correcting and phase shifting circuit shown in FIG. 13 in accordance with some embodiments.

FIG. 26 illustrates an example layout for the correcting and phase shifting circuit shown in FIG. 13 in accordance with some embodiments. The layout 2600 includes a layout of the DCCPS circuit 102, the clock buffer circuit 1304, and the receiver circuit 226. The DCCPS circuit 102 is laid out in a cell 2602. The DCC circuit 206 is positioned adjacent and along the edge 2604 of the cell 2602. The select circuit (MUX) 304 and the DC sampler circuit 210 are positioned at the corner of the cell 2602 along the edges 2608, 2612. A low pass filter (LPF) circuit 2606 is positioned in the corner of the cell 2602 adjacent the edges 2608, 2610. The error amplifier circuit 208 is positioned along the edge 2608 between the select circuit (MUX) 304/DC sampler circuit 210 and the LPF circuit 2606. The select circuit (MUX) 306 and the DC sampler 212 are positioned along the edge 2612 between the digital circuit 308 and the select circuit (MUX) 304/DC sampler circuit 210. The digital circuit 308 is positioned along the edge 2612 and between the DCC circuit 206 and the select circuit (MUX) 306/DC sampler circuit 212. The VCDL circuit 204 is positioned along the edge 2610 and between the DCC circuit 206 and the LPF circuit 2606.

The trace balance 2614 (e.g., signal lines 1306, 1320, and inverter circuits 1308, 1310 in FIG. 13) is positioned between the CLK input and the digital circuit 308 and between the VCDL circuit 204, the DCC circuit 206, the error amplifier circuit 208, and the LPF circuit 2606. The clock buffer circuit 1304 is positioned outside of the cell 2602 between the DCCPS circuit 102 and the receiver circuit 226. The trace balance 2616 (e.g., signal line 1318 and inverter circuits 1314, 1316 in FIG. 13) is positioned between the CLK output, the digital circuit 308, and the receiver circuit 226. The arrows represent the propagation directions of the signals.

Figure 27:
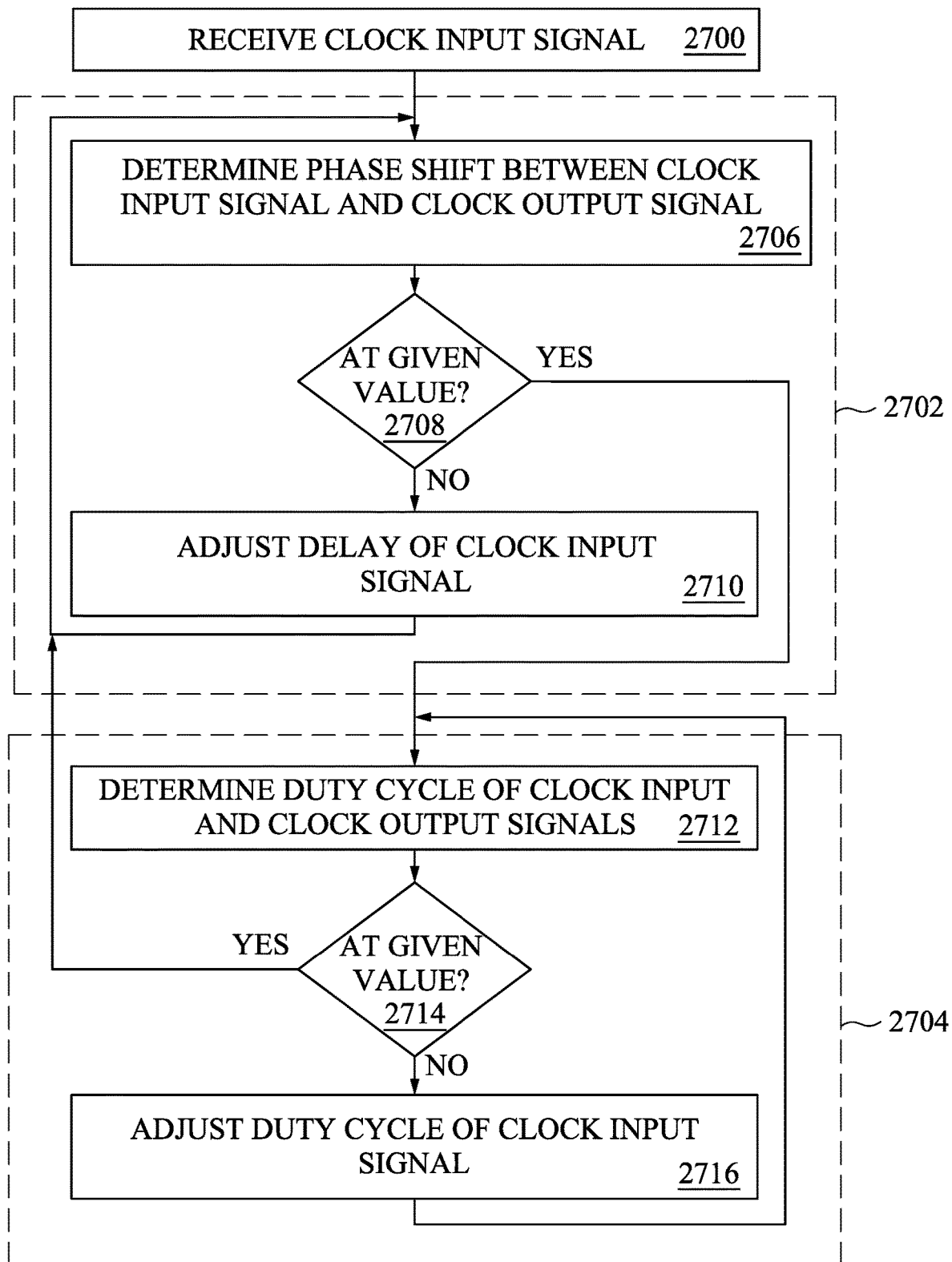
FIG. 27 illustrates a flowchart of a method of correcting a duty cycle and a phase shift in accordance with some embodiments.

FIG. 27 illustrates a flowchart of a method of operating a duty-cycle correcting and phase shift correcting circuit in accordance with some embodiments. Initially, as shown in block 2700, a clock input signal is received. In block 2702, the phase shift between the clock input signal and a clock output signal is adjusted until the phase shift is a given value (or substantially the given value). In one embodiment, the given value is ninety (90) degrees. In another embodiment, the given value is two hundred and seventy (270) degrees.

Next, as shown in block 2704, the duty cycles of the clock input signal and the clock output signal are determined and adjusted until the duty cycles are at a given value (or substantially at the given value). In one embodiment, the given value is fifty percent (50%).

Block 2702 begins at block 2706 where a phase shift between the clock input signal and the clock output signal is determined. A determination is made at block 2708 as to whether the phase shift is at a given value (or substantially at the given value). If the determination is that the phase shift is not at the given value (or not substantially at the given value), the process passes to block 2710 where the delay of the clock input signal is adjusted. In one embodiment, the delay of the clock input signal is adjusted using a VCDL circuit based on an error signal received from an error amplifier circuit. In another embodiment, the delay of the clock input signal is adjusted using a DCDL circuit based on a signal received from a control circuit.

The method then returns to block 2706 and blocks 2706, 2708, 2710 repeat until the phase shift is at the given value (or substantially at the given value). In non-limiting examples, the given value is ninety (90) degrees or two hundred and seventy (270) degrees.

When a determination is made at block 2708 that the phase shift between the clock input signal and the clock output signal is at the given value (or substantially at the given value), the process continues at block 2712 where the duty cycles of the clock input signal and the clock output signal are determined. A determination is made at block 2714 as to whether the duty cycles of the clock input and the clock output signals are at a given value (or substantially at the given value). If the determination is that the duty cycles are not at the given value (or not substantially at the given value), the method passes to block 2716 where the duty cycle of the clock input signal is adjusted. In one embodiment, the duty of the clock input signal is adjusted using a duty cycle corrector circuit.

The method then returns to block 2712 and blocks 2712, 2714, 2716 repeat until the duty cycle of the clock input signal is at the given value (or substantially at the given value). In non-limiting example, the given value is fifty percent (50%).

When a determination is made at block 2714 that the duty cycles of the clock input and the clock output signals are at the given value (or substantially at the given value), the process returns to block 2706.

Aspects of the embodiments disclosed herein are described with reference to block diagrams and/or operational illustrations of methods and systems. However, embodiments are not limited to the operational flowchart shown in FIG. 27. In other embodiments, the operations noted in the blocks of FIG. 27 may occur out of the illustrated order. For example, two blocks shown in succession may in fact be executed substantially concurrently or the blocks may sometimes be executed in the reverse order, depending upon the functionality/acts involved.

Embodiments disclosed herein have a half locking range and a wide locking range. The locking range of the duty-cycle correcting and phase shifting circuit can refer to the maximum and the minimum delays of the VCDL or DCDL circuit in the duty-cycle correcting and phase shifting circuit. For example, the embodiment shown in FIG. 2 has a half locking range and the embodiments depicted in FIGS. 10-16 have a wide locking range.

In one aspect, a correcting and phase shifting circuit includes a voltage-controlled delay line (VCDL) circuit operable to receive a clock input signal and a duty-cycle corrector (DCC) circuit operably connected to an output of the VCDL circuit and operable to adjust a duty cycle of the clock input signal. An error amplifier circuit is operably connected to an input of the VCDL circuit. A first DC sampler circuit is operably connected to a first input of the error amplifier circuit. A second DC sampler circuit is operably connected to a second input of the error amplifier circuit.

In another aspect, a correcting and phase shifting circuit includes a delay-controlled delay line (DCDL) circuit that is operable to receive a clock input signal, and a duty-cycle corrector (DCC) circuit operably connected to an output of the DCDL circuit and operable to adjust a duty cycle of the clock input signal. A control circuit is operably connected to an input of the DCDL circuit, an output signal of the control circuit operable to control an amount of delay generated by the DCDL circuit. A lock detector circuit is operably connected between a first input of the control circuit and a first output of a comparator circuit. An output signal of the lock detector circuit is operable to control the output of the control circuit. A counter circuit is operably connected between a second input of the control circuit and a second output of the comparator circuit. A first DC sampler circuit is operably connected to a first input of the comparator circuit. A second DC sampler circuit is operably connected to a second input of the comparator circuit.

In yet another aspect, a method of operating a duty-cycle correcting and phase shifting circuit includes receiving a clock input signal and determining a phase shift between the clock input signal and a clock output signal of the duty-cycle correcting and phase shifting circuit. Based on a determination that the phase shift is not at least substantially at a first given value, a delay of the clock input signal is adjusted until the phase shift is at least substantially at the first given value. A duty cycle of the clock input signal and a duty cycle of the clock output signal are determined. Based on a determination that the duty cycles are not at least substantially at a second given value, the duty cycle of the clock input signal is adjusted until the duty cycles of the clock input and the clock output signals are at least substantially at the second given value. In one embodiment, a voltage-controlled delay line circuit in the duty-cycle correcting and phase shifting circuit is used to adjust the delay of the clock input signal and a duty cycle corrector circuit in the duty-cycle correcting and phase shifting circuit is used to adjust the duty cycle of the clock input signal. In another embodiment, a digital-controlled delay line circuit in the duty-cycle correcting and phase shifting circuit is used to adjust the delay of the clock input signal and a duty cycle corrector circuit in the duty-cycle correcting and phase shifting circuit is used to adjust the duty cycle of the clock input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A correcting and phase shifting circuit, comprising:
   a voltage-controlled delay line (VCDL) circuit operable to receive a clock input signal;
   a duty-cycle corrector (DCC) circuit operably connected to an output of the VCDL circuit and operable to adjust a duty cycle of the clock input signal;
   an error amplifier circuit operably connected to an input of the VCDL circuit;
   a first DC sampler circuit operably connected to a first input of the error amplifier circuit; and
   a second DC sampler circuit operably connected to a second input of the error amplifier circuit.

2. The correcting and phase shifting circuit of claim 1, further comprising a clock tree circuit operably connected to an output of the DCC circuit.

3. The correcting and phase shifting circuit of claim 2, further comprising:
   a first select circuit operably connected to an output of the clock tree circuit;
   a second select circuit operably connected to an input of the first DC sampler circuit; and
   a third select circuit operably connected to an input of the second DC sampler circuit.

4. The correcting and phase shifting circuit of claim 2, further comprising a clock tree replica circuit operably connected between the output of the DCC circuit and to an input of the clock tree circuit.

5. The correcting and phase shifting circuit of claim 1, further comprising a digital circuit operably connected to inputs of the first and the second DC sampler circuits and another input of the VCDL circuit, the digital circuit operable to receive the clock input signal and output two pulse signals.

6. The correcting and phase shifting circuit of claim 5, further comprising:
   a clock buffer replica circuit operably connected to a first input of the digital circuit; and
   a clock buffer circuit operably connected to a second input of the digital circuit.

7. The correcting and phase shifting circuit of claim 5, further comprising:
   a phase modulator circuit operably connected to a first input of the digital circuit; and
   a clock buffer circuit operably connected to a second input of the digital circuit.

8. The correcting and phase shifting circuit of claim 1, further comprising a low dropout circuit operably connected to another input of the VCDL circuit.

9. The correcting and phase shifting circuit of claim 1, further comprising a low dropout circuit operably connected between the input of the VCDL circuit and an output of the error amplifier circuit.

10. A method of operating a duty-cycle correcting and phase shifting circuit, comprising:
    receiving a clock input signal;
    determining a phase shift between the clock input signal and a clock output signal of the duty-cycle correcting and phase shifting circuit;
    based on a determination that the phase shift is not at least substantially at a first given value, adjusting, using a voltage-controlled delay line circuit in the duty-cycle correcting and phase shifting circuit, a delay of the clock input signal until the phase shift is at least substantially at the first given value;
    determining a duty cycle of the clock input signal and a duty cycle of the clock output signal; and
    based on a determination that the duty cycles are not at least substantially at a second given value, adjusting, using a duty cycle corrector circuit in the duty-cycle correcting and phase shifting circuit, a duty cycle of the clock input signal until the duty cycles of the clock input and the clock output signals are at least substantially at the second given value.

11. The method of claim 10, wherein:
    the first given value is one of ninety degrees or two hundred and seventy degrees; and
    the second given value is fifty percent.

12. The method of claim 10, further comprising:
    providing the clock output signal to a clock tree circuit.

13. A correcting and phase shifting circuit, comprising:
    a voltage-controlled delay line (VCDL) circuit operable to receive a clock input signal;
    a duty-cycle corrector (DCC) circuit operably connected to an output of the VCDL circuit and operable to adjust a duty cycle of the clock input signal;
    a clock tree circuit operably connected to an output of the DCC circuit;
    an error amplifier circuit operably connected to an input of the VCDL circuit;
    a first DC sampler circuit operably connected between an output of the clock tree and a first input of the error amplifier circuit; and
    a second DC sampler circuit operably connected between the output of the clock tree and a second input of the error amplifier circuit.

14. The correcting and phase shifting circuit of claim 13, further comprising:
   a first select circuit operably connected to an output of the clock tree circuit;
   a second select circuit operably connected to an input of the first DC sampler circuit; and
   a third select circuit operably connected to an input of the second DC sampler circuit.

15. The correcting and phase shifting circuit of claim 13, further comprising a clock tree replica circuit operably connected between the output of the DCC circuit and to an input of the clock tree circuit.

16. The correcting and phase shifting circuit of claim 13, further comprising a digital circuit operably connected to inputs of the first and the second DC sampler circuits and another input of the VCDL circuit, the digital circuit operable to receive the clock input signal and output two pulse signals.

17. The correcting and phase shifting circuit of claim 16, further comprising;
   a clock buffer replica circuit operably connected to a first input of the digital circuit; and
   a clock buffer circuit operably connected to a second input of the digital circuit.

18. The correcting and phase shifting circuit of claim 16, further comprising;
   a phase modulator circuit operably connected to a first input of the digital circuit; and
   a clock buffer circuit operably connected to a second input of the digital circuit.

19. The correcting and phase shifting circuit of claim 13, further comprising a low dropout circuit operably connected between the input of the VCDL circuit and an output of the error amplifier circuit.

20. The correcting and phase shifting circuit of claim 13, further comprising a low dropout circuit operably connected to another input of the VCDL circuit.

* * * * *